US005591945A

United States Patent [19]
Kent

[11] Patent Number: 5,591,945
[45] Date of Patent: Jan. 7, 1997

[54] ACOUSTIC TOUCH POSITION SENSOR USING HIGHER ORDER HORIZONTALLY POLARIZED SHEAR WAVE PROPAGATION

[75] Inventor: Joel Kent, Fremont, Calif.

[73] Assignee: Elo TouchSystems, Inc., Oak Ridge, Tenn.

[21] Appl. No.: 424,216

[22] Filed: Apr. 19, 1995

[51] Int. Cl.$^6$ .................................................. G08C 21/00
[52] U.S. Cl. .............................. 178/19; 345/177; 367/907
[58] Field of Search ........................ 178/18, 19; 345/177; 367/140, 168, 189, 191, 907

[56] References Cited

U.S. PATENT DOCUMENTS

| | | |
|---|---|---|
| Re. 33,151 | 1/1990 | Adler . |
| 3,673,327 | 6/1972 | Johnson et al. . |
| 4,295,214 | 10/1981 | Thompson ............................. 367/140 |
| 4,642,423 | 2/1987 | Adler . |
| 4,644,100 | 2/1987 | Brenner et al. . |
| 4,645,870 | 2/1987 | Adler . |
| 4,700,176 | 10/1987 | Adler . |
| 4,746,914 | 5/1988 | Adler . |
| 4,791,416 | 12/1988 | Adler . |
| 5,072,427 | 12/1991 | Knowles . |
| 5,162,618 | 11/1992 | Knowles . |
| 5,177,327 | 1/1993 | Knowles . |
| 5,243,148 | 9/1993 | Knowles ................................. 178/18 |
| 5,329,070 | 7/1994 | Knowles . |

Primary Examiner—Wellington Chin
Assistant Examiner—Paul Loomis
Attorney, Agent, or Firm—Furgang & Milde, LLP

[57] ABSTRACT

An acoustic touch position sensor having a transducer which imparts a wave, propagating along a first axis. A reflective array disposed along the first axis which reflects the wave as a set of waves having a horizontally polarized component and a non-uniform volumetric energy density along an axis normal to said surface, traveling along a different axis into the touch surface region of the substrate. The waves are partially absorbed, attenuated or perturbed by an object touching the substrate, to create a modified waveform having characteristics indicative of the axial displacement and/ or contact condition of the object with the substrate. The wave perturbation is detected by collecting the set of waves with a reflective array, which redirects the wave energy to a receiving transducer. The transducers preferably produce and are responsive to Rayleigh type waves, with the reflective arrays mode-converting acoustic wave energy between higher order horizontally polarized shear waves and Rayleigh type waves.

125 Claims, 12 Drawing Sheets

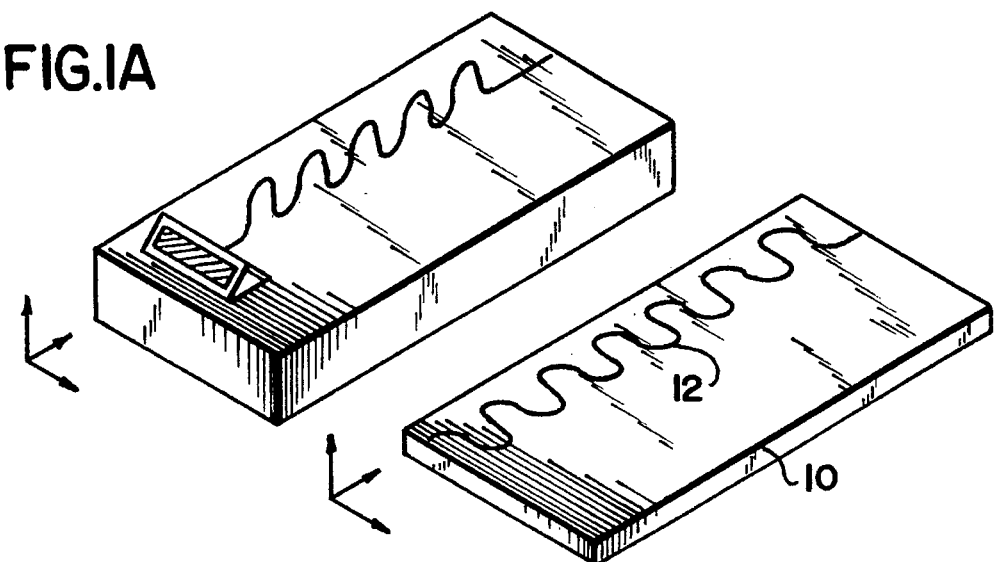
FIG.1A
FIG.2A
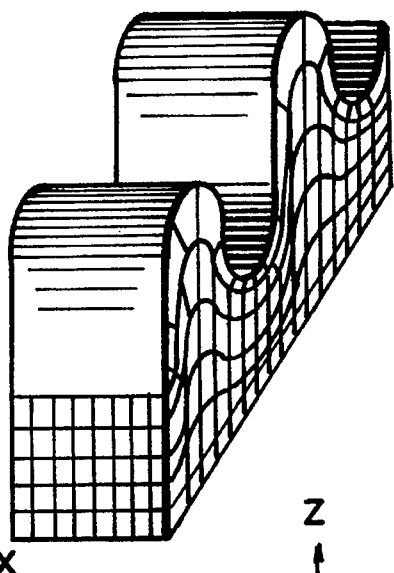
FIG.1B
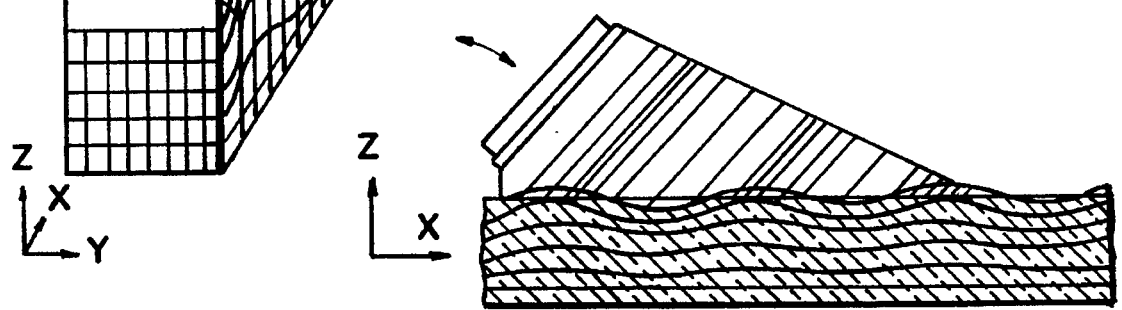
FIG.1C

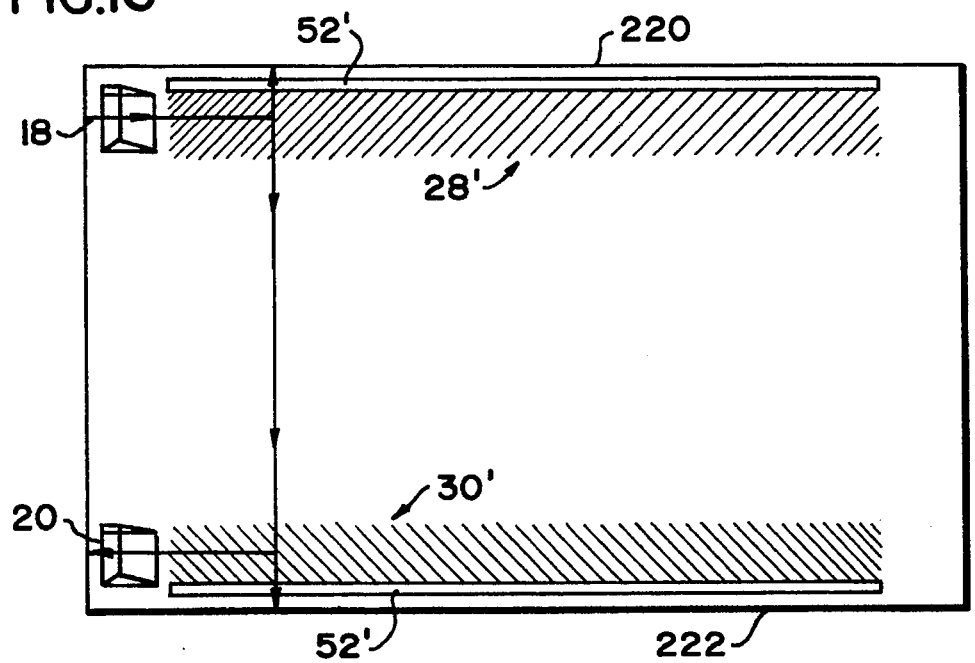
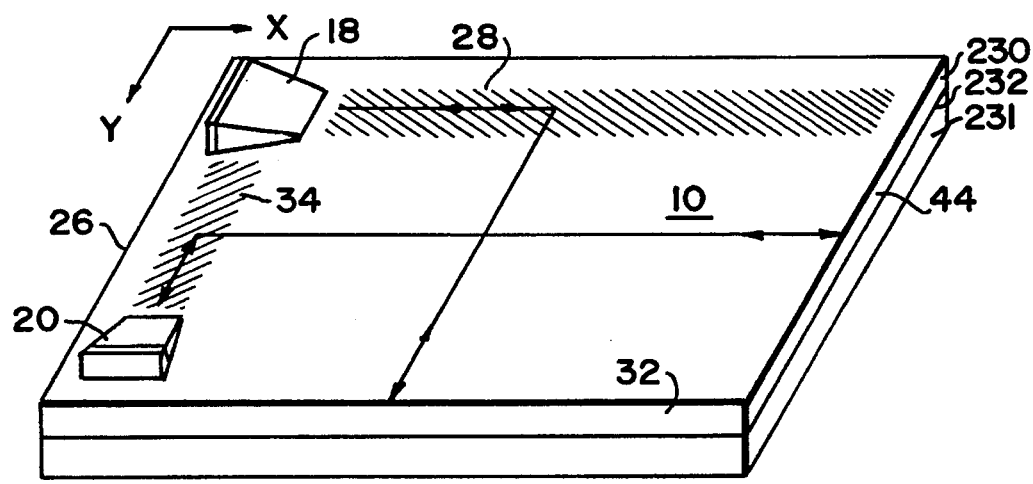

ACOUSTIC TOUCH POSITION SENSOR USING HIGHER ORDER HORIZONTALLY POLARIZED SHEAR WAVE PROPAGATION

TECHNICAL FIELD OF THE INVENTION

The present invention relates to an acoustic touch position sensor and more particularly to such a sensor wherein a horizontally polarized shear-like wave having an order greater than zero is imparted into a substrate, the shear-like wave propagating in the substrate along a wavefront having a range of characteristic time delays from a transmitted signal, representing plurality of paths of differing lengths where each path is associated with a different axial displacement along the substrate. A touch on the substrate results in a perturbation of the wave, which is sensed to determine the axial displacement of the touch on the substrate.

BACKGROUND OF THE INVENTION

Acoustic touch position sensors are known to include a touch panel or plate having an array of transmitters positioned along a first edge of a substrate for simultaneously generating parallel surface acoustic waves that directionally propagate through the panel to a corresponding array of detectors positioned opposite the first array on a second edge of the substrate. Another pair of arrays is provided at right angles to the first set. Touching the panel at a point causes an attenuation of the waves passing through the point of touch, thus allowing an output from the two sets of arrays indicative of the coordinates of the touch. This type of acoustic touch position sensor is shown in U.S. Pat. No. 3,673,327.

The substrate in many embodiments is preferred to be transparent because this allows efficient and effective use of the touch sensor as a panel placed in front of a visual display device, such as a cathode ray tube, electroluminescent display, or liquid crystal display.

Acoustic touch position sensors are also known wherein a single transducer per axis is provided, which produces a surface acoustic wave which is reflected, by a reflective grating having elements set at 45° to the beam, at right angles over the length of the grating to produce a surface acoustic wave pattern propagating through an active area of the substrate. The position of a touch in the active area is determined by, e.g., providing an opposing reflective grating which directs the surface acoustic wave pattern along an axis of the grating toward a receiving transducer system, which records the time of arrival of an attenuation of the wave pattern, which corresponds to a position along the axis of the arrays. The touch, in this case, may include a finger or stylus pressing against the surface. Other types of configurations for collecting the sensing signal are also known.

The reflective array is formed of acoustically partially reflective structure, which may be an inscribed or raised surface feature, or a feature having differing wave propagation characteristics which forms a partial barrier. These structural elements may, in theory, be formed at any portion where there is a significant wave energy. Thus, if a wave has surface energy, surface features may be used. If wave energy is buried, then these barriers must intrude into the material of the substrate. Thus, waves having surface energy, these reflecting arrays may be formed on the surface, and where wave energy is present on both sides of the substrate, these reflecting arrays may be formed on one or both sides of the substrate. Because the touch sensor is generally placed in front of a display device, and the reflective array is not generally optically invisible, the reflective arrays are generally placed at the periphery of the substrate, outside of the active sensing area, and are hidden or protected under a bezel.

There are a number of different types of acoustic wave propagation types which are supported by solid non-piezoelectric substrates, such as glass. Those having vertical, e.g., in the thickness direction, and longitudinal, e.g., in the direction of wave motion, components are referred to herein as VLCW, a type of surface acoustic wave. These VLCW, in substrates having a finite thickness, are either quasi-Rayleigh waves, which have surface energy primarily confined to a single surface over finite distances, or Lamb waves, which have surface energy on the front and rear surfaces of a substrate. Over extended distances, it becomes apparent that real quasi-Raleigh waves include a symmetric Lamb wave component and an antisymmetric Lamb wave component, and that these components have differing phase velocities. Thus, in realizable systems, surface waves are not truly confined to a single surface over large distances, and may lead to artifacts. These are discussed more fully below.

While a touch sensor employing quasi-Rayleigh waves have high sensitivity, this mode of operation may lead to high or even excessive sensitivity to contaminants or other materials abutting the active surface of the touch panel. The excessive sensitivity to contamination is due, in part, to the vertical component of wave motion at or near the confining surface. As a result, a large portion of the quasi-Rayleigh wave energy may be absorbed by even modest amounts of surface contaminants. The effect of near or total absorption of wave energy by contamination, sealants or other materials abutting the plate, is to create acoustic shadows or blind spots extending along the axes that intersect the contaminant. Thus, while quasi-Rayleigh mode touch sensors have a high sensitivity to touch, these sensors are also subject to shadowing in the event of a substantial contaminant in the active area, preventing localization of a touch on one or both axes of the sensor. A touch position sensor using quasi-Rayleigh waves therefore cannot localize touch if one or both coordinates is on a blinded axis.

Shear waves also propagate in substrates of finite thickness, and as employed in touch position sensors of the prior art, these shear waves are of zeroth order, meaning that there is no nodal plane intersecting the substrate, and the volumetric wave energy is uniform. Since shear waves do not have a vertical component of motion, small amounts of surface contaminants do not absorb all of the wave energy, and therefore do not completely shadow, and therefore shear mode sensors are more robust in contaminated environments. More complex waves, having multiple nodal planes intersecting a substrate are also known in theory, but these are generally considered complex interfering waves, without practical value for touch measurement or the like, and are therefore avoided for use in touch position sensors or eliminated if interfering. These complex waves have certain characteristics similar to zeroth order horizontally polarized shear waves, or more simply shear waves, yet other of their characteristics also differ markedly. These waves shall be herein referred to as higher order horizontally polarized shear-like waves, or HOHPS waves. Such waves have a high degree of dependence on the characteristics of the substrate and sensitivity to the configuration.

The wave pattern of known acoustic touch sensors is dispersed along the axis of the transmitting reflective array, traverses the substrate and is recombined, e.g., into an axially propagating wave, dispersed in time according to the path taken across the substrate, by another reflective grating, and is directed to a receiving transducer in a direction antiparallel to the transmitted wave, which receives the wave and converts it into an electrical signal for processing. Thus, according to this system, only two transducers per axis are required. Because of the antiparallel path, the time delay of a perturbation of the electrical signal corresponds to a distance travelled by the wave, which in turn is related to the axial distance from the transducer along the reflecting arrays travelled by the wave before entering the active area of the substrate. The location of touch is determined by detecting an attenuated signal as compared to a standard received waveform. Thus, for each axis, a distance may be determined, and with two orthogonal axes, a unique coordinate for the attenuation determined. Acoustic touch position sensors of this type are shown in U.S. Pat. Nos. 4,642,423, 4,644,100, 4,645,870, 4,700,176, 4,746,914 and 4,791,416, incorporated herein by reference.

For each axis, a standard signal is provided to the transducer by interfacing a piezoelectric transducer with the sheet-like member, outside the active area, to produce a wave, propagating along an axis. For example, surface waves are generally coupled through the surface portion of the substrate, on the side which is intended to be touch sensitive. The reflective array in the path of the wave, for redirecting the wave into the touch sensitive region, includes a series of spaced surface interruptions, having a separation of an integral number of wavelengths of the wave produced by the transmitting transducer, angled 45° to the axis, i.e., the direction of wave propagation. The reflective array thus produces a reflected a surface acoustic wave propagating at 90° to the original angle of transmission, through the active area of the substrate.

As shown in FIGS. 1A and 1C, surface acoustic waves may be transduced, with a certain coupling efficiency, into a touch plate utilizing a transducer mounted on a wedge that is in turn mounted on the touch surface of the plate, wherein the transducer vibrates in the direction shown to produce a compressional bulk wave that propagates in the wedge, which in turn is transduced through the wedge-substrate interface to impart a surface acoustic wave, i.e., a wave having vertically and longitudinal components (VLCW), in the touch plate. The wedge extends above the plate, and therefore the rear or inactive side of the substrate and its edges remain free of circuitry or critical elements. Further, the area of the substrate in which the wave energy is in the form of quasi-Rayleigh mode waves is insensitive to mounting on the opposite, inactive surface. Coupling wedges are typically made of plastic, and mounted to a glass plate. The transducer, which is generally a piezoelectric element with electrically conducting pads on two large area opposing faces, is bonded to the plastic wedge with a conductive element in between, and the transducer with wedge is then bonded to the glass touch plate substrate, with the sandwiched conductive element and opposing electrically conductive pad connected to the electrical circuitry.

To receive the sensing wave, it is generally considered desirable to provide a single transducer for transducing the wave into an electrical signal in which the touch position is encoded by temporal fluctuations in the signal. While a transducer the full length of the substrate could be provided, this requires a large transducer. Instead, the art teaches an inverse of the transmission technique, multiplexing the sensing wave into a surface wave directed toward a small receiving transducer. Thus, in an area outside the active area, the waves are again reflected by an otherwise identical reflecting array having spaced interruptions at −45° to the angle of wave propagation, thereby multiplexing the spatially dispersed signal into a single waveform pattern, propagating antiparallel to the transmitted surface acoustic wave, which is detected by another transducer. In known systems, the excitation frequency is generally around 5 MHz or 5.5 MHz, and the thickness of the sheet-like member, if formed of soda-lime glass is typically in the range from 0.090" to 0.125".

The art also teaches the use of a single transducer for both transmitting the wave and receiving the sensing wave, with a single reflective array employed to disperse and recombine the wave. Such systems therefore employ a reflective edge opposite the reflective array. As a result, the SAW wave passes through the active region twice, with consequent increased wave absorption by the touch but also increased overall signal attenuation due to the reflection and additional pass through the active region of the substrate. Thus, the SAW wave may be reflected off an edge of the substrate parallel to the axis of the transmission reflective grating and reflected back through the substrate to the reflective array and retrace its path back to the transducer. The transducer, in this case, is configured to act as both transmitter and receiver at appropriate time periods. A second transducer, reflective array and reflective edge are provided for an axis at right angles to allow determination of a coordinate of touch.

A related system provides for a single transducer which produces a sensing wave for detecting touch on two axes, which both produces the acoustic wave and also receives the wave from both axes. In this case, the area in which touch is to be sensed is generally oblong, such that the longest characteristic delay along one path is shorter than the shortest characteristic delay along the second path.

Adler, U.S. Pat. Re No. 33,151, relates to a touch-sensitive system for determining a position of a touch along an axis on a surface. A SAW generator is coupled to a sheet-like substrate to generate a burst of waves, which are deflected into an active region of the system by an array of wave redirecting gratings. Quasi-Rayleigh waves traversing the active region are in turn redirected along an axis by gratings to an output transducer. The redirecting gratings are oriented at 45° to the axis of propagation. A location of touch is determined by analyzing a selective attenuation of the received waveform in the time domain, each characteristic delay corresponding to a locus on the surface. The grating elements are placed at a 45° angle and spaced at integral multiples of the quasi-Rayleigh wavelength with dropped elements to produce an approximately constant SAW power density over the active area. Thus the spacing between grates decreases with increasing distance along the axis of propagation from the transducer, with a minimum spacing of one wavelength of the transmitted wave. U.S. Pat. No. 4,746,916 also teaches use of reflecting elements which vary in height to control a ratio of reflected wave power to unreflected wave power.

Brenner et al., U.S. Pat. No. 4,644,100 relates to a touch sensitive system employing surface acoustic waves, responsive to both the location and magnitude of a perturbation of the SAW. The system according to U.S. Pat. No. 4,644,100 is similar in execution to the system according to U.S. Pat. Re. No. 33,151, while determining an amplitude of a received wave and comparing it to a stored reference profile.

Optimization of the performance of a touch sensor using Rayleigh waves is difficult because touch sensitivity and minimum touch panel thickness are not independent choices. In order to support a quasi-Rayleigh wave in a touch panel of reduced thickness, its other dimensions remaining the same, the wavelength must be reduced to preserve single surface confinement over the active area of the substrate. It is characteristic of quasi-Rayleigh waves that their confinement depth is related to wavelength, with confinement depth decreasing as the wavelength is decreased. As a result, the wave is confined to a shallower region bounded by the surface, and the proportion of wave energy absorbed by a given absorbing medium at the surface is increased, approximately by the inverse square of the wavelength. Thus, quasi-Rayleigh wave touch sensors can be considered unduly sensitive for some applications, even for relatively thick panels, hence the effect of reducing touch panel thickness results in touch sensors even more sensitive to surface contamination and other abutments. Conversely, the prior art teaches that reducing sensitivity by increasing the quasi-Rayleigh wavelength results in increased panel thickness and weight.

Surface waves having vertical and longitudinal components, with substantial energy through the thickness of the substrate, are termed Lamb waves, and systems incorporating same to detect touch position are disclosed in U.S. Pat. No. 5,072,427 and U.S. Pat. No. 5,162,618. As discussed above, Lamb waves are dispersive, varying in phase and velocity, so that various Lamb mode waves propagating in a substrate will interfere with one another. Therefore, systems employing Lamb waves also include elements to separate or eliminate unwanted or interfering propagation modes.

For example, it is known to place elements of the reflective arrays on both sides of the substrate in order to facilitate selection between the zeroth order symmetric and zeroth order anti-symmetric wave, by distinguishing between the phase of the array, i.e., placement and spacing of the elements, on the upper and lower surfaces of the substrate.

Acoustic touch position sensors utilizing surface acoustic waves as taught by the above-mentioned patents have a number of problems which are more readily understood when the nature of the surface acoustic wave used in these sensors is more fully considered. If, as in the above mentioned patents, the touch plate consists of a uniform, non-piezoelectric medium, and the acoustic wave is confined at or near a single surface such as an outer surface of the touch plate, the surface acoustic wave is known as a Rayleigh wave. These waves have X and Z components such that disturbed particles move elliptically in the X-Z plane. It is characteristic of these waves that the volumetric wave energy rapidly decreases with depth, so that the wave energy along the Z axis is essentially confined at or near the surface of the touch plate.

Theoretically, true Rayleigh waves exist only in an infinitely thick medium. Waves in a uniform, non-piezoelectric medium of finite thickness that are essentially confined to a single surface, as shown in FIGS. 1A–1D, are more precisely termed quasi-Rayleigh waves. Given a long enough propagating path in a medium of finite thickness, Rayleigh-type wave energy will not be confined at or near a single surface, but will transfer back and forth between the outer surfaces of the plate. This is because, although small, wave energy components extend through the material thickness, consisting of at least a symmetric and an antisymmetric waveform, each of which travels at a slightly different phase velocity, thus causing constructive and destructive interference at various spaced loci on the surfaces of the substrate, i.e., loci on the surfaces which have constructive or destructive interference of the two wave components. Areas of low surface wave energy are insensitive to perturbing influences, e.g., touch, while areas of relatively high surface energy may be overly sensitive and contribute to artifacts.

If the thickness of a touch plate substrate is, for example, two Rayleigh wavelengths or less, the waves emanating from the source transducers are Lamb mode, and are clearly distinguishable from quasi-Rayleigh mode, as well as other surface acoustic wave (SAW) modes, shown in FIGS. 1E and 1F. Lamb waves exist in two groups of various orders, each of which propagates independently of one another. One group is characterized by particle displacement that is symmetric with respect to the median plane of the plate. The other group of Lamb waves is characterized by particle displacement that is anti-symmetric with respect to the median plane. In general, a specific order within the symmetric Lamb wave group differs in phase and group velocity from the identical order of the anti-symmetric Lamb wave group. In particular, with a sufficient plate thickness equal to or greater than two Rayleigh wavelengths, two modes of approximately equal amplitude are principally excited, the zeroth order symmetrical Lamb waves and the zeroth order anti-symmetrical Lamb waves. As seen in FIGS. 1E and 1F, the symmetrical and anti-symmetrical Lamb waves are not confined to a single surface of the touch plate, but extend through the plate to the opposite surface thereof. When "in phase" however, such as the condition that is initially at and close to the source of the waves, where the waves constructively interfere on one surface and destructively interfere on the other surface, the two Lamb waves combine to produce a quasi-Rayleigh wave, as can be seen from a comparison of FIGS. 1E and 1F to FIG. 1D. As the two Lamb wave modes travel further from the source, due to the differing phase velocities and the resultant phase difference between them, there is an apparent complete transference of wave energy from the outer surface on which the transducer generating the wave is mounted, to the opposite surface. This transference of energy between the outer surfaces of the plate occurs at regularly spaced intervals, making a touch plate having large enough dimensions for this transference to occur, generally unsuitable for a touch position sensor, so long as both wave modes are present. As proposed in the above patents, these modes may be filtered and the unwanted modes eliminated.

In the case of a substrate of about four Rayleigh wavelengths thick, most of the wave energy of a quasi-Rayleigh wave remains on a single surface, and therefore a substrate of limited size is sensitive without dead spots due to wave dispersion over its entire surface. Thus, touch position sensors utilizing surface acoustic waves, and more particularly quasi-Rayleigh waves, operate with relatively thick panels, i.e., panels having a thickness of three to four times the wavelength of the surface acoustic wave propagating therein, with the quasi-Rayleigh waves confined at and near a single surface.

A touch sensor according to the above Rayleigh mode wave touchsensor patents, would be inoperable with a thin glass substrate, e.g., 0.045" soda-lime glass with an operating frequency of about 5 MHz, because a touch in a region of one outer surface where complete transference of the wave energy to the opposite outer surface has taken place, will not detectably disturb the wave, and is therefore limits the usability of the sensor for the intended purpose. In practice, in order to provide a wave that is practically confined to a single surface, the thickness of the touch plate must be at least three to four times the wavelength of the wave imparted into the substrate, wherein the length and breadth of the touch plate are also limited. The substrate may have dimension from about 25 to in excess of 1000 wavelengths of the SAW wave, which allows substrates of about 1.5 to 70 cm with an operating wavelength of 0.0574 cm, and operating frequency of 5.53 MHz.

It is thus known to use, instead of a quasi-Raleigh wave, a order Lamb wave transmitted through the bulk sheet-like material. Such a wave travels through the full thickness of the substrate, and the system is sensitive to touch on both surfaces of the sheet. This creates difficulty in mounting the substrate, which is generally a transparent substrate for placement in front of a cathode ray display (CRT) tube. Further, related to this sensitivity on both sheet surfaces, the signal-to-noise ratio is reduced, due to wave energy on both an active and inactive surface. In addition, vertical components of transverse wave propagation are highly sensitive to attenuation by small amounts of water, which may create artifacts.

In a zeroth order Lamb mode system, the maximum thickness of the substrate is limited to about two times the wavelength of the excited wave. Thicker substrates, under similar conditions, would propagate such waves as quasi-Raleigh mode waves, and substantial energy of the wave would not be present through the full thickness of the substrate. Thin glass has a greater difference in phase velocity of the symmetric and antisymmetric Lamb mode waves propagating therein than a thicker substrate, which allows simplified and selective filtering of wave modes, as suggested in U.S. Pat. No. 5,072,427.

It is known to create a zeroth order Lamb mode wave from a zeroth order shear wave, by reflection of the shear wave by an array of parallel interruptions spaced along the axis of propagation of the shear wave at integral multiples of the wavelength of the desired Lamb wave mode in the substrate, the reflective elements being situated at an angle of:

$$\theta_A = \arctan(V_L/V_Z)$$

where $\theta_A$ is the angle of the converting elements to the X axis, $V_L$ is the phase velocity of the desired Lamb mode wave and $V_Z$ is the velocity of the zeroth order horizontally polarized shear wave propagating along the axis of the array.

Likewise, a propagating zeroth order horizontally polarized shear wave may be converted to a Lamb wave by arrays having elements on both surfaces of the substrate, which facilitates selection between the zeroth order symmetric and zeroth order antisymmetric Lamb wave, by the relative phase of the array on the upper and lower surfaces of the substrate. The Lamb mode wave is reflected by a reflecting array, with elements on one or both sides of the substrate, to an opposed receiving transducer system, or may be reflected off a distal edge of the substrate and transmitted back through the active area, where it is reflected along the axis of the array as a zeroth order horizontally polarized shear wave, for detection by a combination excitation and reception transducer.

It has also been proposed to impart zeroth order shear waves into a substrate which are converted into Lamb waves by a reflective array, which are then converted by a reflective array back into shear waves for detection of the zeroth order component, see U.S. Pat. No. 5,072,427.

Shear wave mode touch sensors are also known. These systems operate by exciting zeroth order shear waves, which are non-dispersive, in a substrate. A touch absorbs only a small percentage of the shear wave energy intercepted by a touched surface, thus leading to relatively low sensitivity but also improved resistance to shadowing artifacts. In fact, the percentage of intercepted energy absorbed by a given touch is about five times greater for a Rayleigh wave than it is for a comparable zeroth order horizontally polarized shear wave for practical touch plate thickness. Such a zeroth order horizontally polarized shear wave system is proposed in U.S. Pat. No. 5,177,327. See also Knowles, T. J., "46.6: A Pressure-Responsive Touch-input Device" *SID* 92 *Digest,* (1992) pp. 920–923; Christensen, R. and Masters, T., "Guided Acoustic Wave: Newest Wave in Touch Technology", *ECN* (January 1995), pp. 13 et seq.

Increasing the thickness of the substrate facilitates HOHPS wave propagation, which heretofore has been considered parasitic. Therefore, known shear wave touch sensors have expressly limited substrate thickness to help limit or eliminate these HOHPS modes, as well as other wave modes, such as quasi-Rayleigh waves. Higher order horizontally polarized shear waves are dispersive, and therefore a configuration which promotes wave energy components of these types has been considered difficult or unworkable. Thus, in theory, mixed HOHPS waves in the active region of the touch sensor would follow pattern similar to that exhibited by Lamb waves, having "dead spots" on the substrate surface due to dispersion of the various components.

Zeroth order horizontally polarized shear wave touch sensors may be arbitrarily thin, limited only by their structural integrity. It is known, in order to limit potentially interfering modes, that the thickness of the substrate in a zeroth order horizontally polarized shear wave touch position sensor be less than that capable of supporting quasi-Rayleigh waves, since the thinner the substrate, the greater the fractional sensitivity of the horizontally polarized shear wave to a surface touch.

According to U.S. Pat. No. 5,177,327, a thin glass substrate, e.g., 0.040" thick, is desired because it has higher sensitivity to touch-induced attenuation of zeroth order horizontally polarized shear waves in the active area, has a lower weight than thicker glass, e.g., 0.090", as is often used in quasi-Raleigh mode touch sensors. However, 0.090" glass is easier to form and less fragile than 0.040" thick glass.

Knowles, U.S. Pat. No. 5,329,070 relates to a zeroth order horizontally polarized shear wave touch localization sensor. U.S. Pat. No. 5,329,070 indicates that an advantage of using a zeroth order horizontally polarized shear wave is that the sensor may be arbitrarily thin, and in fact the substrate is maintained at a thickness of less than 2 wavelengths in order to suppress higher order modes or overtones. In order to increase the thickness of the substrate in excess of two wavelengths for superior rigidity, a back plate is bonded by an adhesive which does not support shear wave propagation, or the back plate has a shear wave propagation velocity greater than the substrate shear wave propagation velocity. The latter type of shear wave is known as a Love wave.

Zeroth order horizontally polarized shear waves are not confined to the surface of the substrate, as are quasi-Rayleigh waves, but rather extend throughout the entire thickness of the substrate. Contaminants or other materials abutting the surface of a shear wave touch position sensor are less likely to result in blind spots or significant shadows extending along the axes that intersect the contaminate or matter. VLCW have a vertical transverse component and are substantially absorbed by water droplets on the surface while shear and shear-type waves, without a vertical transverse component do not substantially radiate pressure waves into water droplets at the surface, and are thus do not have undesired sensitivity to these contaminants. Thus, a significant portion of the wave energy will pass through the location of a touch or surface artifact. Therefore, shear wave touch position sensors are suitable for use in environments that surface acoustic wave sensors may not be. Shear wave touch position sensors are also sensitive to a touch on both the top and bottom surfaces of the substrate whereas surface acoustic wave sensors are sensitive to touch only on the surface of the substrate on which the transducer is mounted. These factors, as well as wave properties allow comparable shear mode waves to travel over greater distances than surface acoustic wave.

Zeroth order horizontally polarized shear waves thus are known to have several advantages over surface acoustic waves, which compensate for the lower percentage of total energy absorbed by a touch. As known in the art, however, the proposed implementations are difficult to work with and present their own difficulties and limitations.

SUMMARY OF THE INVENTION

The present invention provides a touch sensitive sensor system which operates in a higher order horizontally polarized shear (HOHPS) wave transmission mode through an active region of the sheet-like material, i.e., the substrate, in order to overcome the deficits of the prior art. In particular, the present invention provides an active area having a substrate which supports higher order horizontally polarized shear waves, in which a particular wave order is propagated and selected for localization and/or characterization of touch.

Love waves have much in common with HOHPS waves. Both are horizontally polarized shear waves with a nonuniform power distribution in depth. It is within the scope of this invention to substitute Love waves for HOHPS waves in many embodiments described herein for the present invention.

The shear wave touch sensor according to the present invention includes a sheet-like substrate that is capable of propagating a higher order horizontally polarized shear wave of order greater than zero; a transducer, producing a source wave having vertical and longitudinal components; means for converting portions of the source wave to a higher order horizontally polarized shear wave in the substrate, travelling along an axis different than the axis of propagation of the source wave from the transducer, said higher order horizontally polarized shear wave travelling through an active region of the substrate, wherein a touch on the substrate detectably perturbs the shear wave. In like manner, another wave or wave component may be transmitted through the substrate along a different axis having a propagation vector component normal to the first wave in order to allow determination of the coordinates of the touch or perturbing influence. The characteristic of the touch or perturbing influence detected may be a pressure, acoustic absorption factor, vibration, size and/or shape, movement, or other known property which will produce a measurable perturbation in the wave.

The present invention also provides a system which excites a plurality of wave modes within a substrate and selectively filters the various modes of vibration to select the desired properties or modes of the vibration. The present mode selection is preferably obtained by providing an array of reflectors, e.g., a closely spaced parallel interruptions, along the axis of wave propagation from the transducer, which are at an angle selected so that the desired wave mode emanates at a desired angle, and undesired modes emanate at different angles. The plurality of wave modes are excited by transducing a surface wave into the substrate, which is incident on the reflective array, and converted into the plurality of wave modes. Because the phase velocity of the transmitted surface wave and the reflected various wave modes differ, the angle of the reflective arrays with respect to the axis of the transducer is generally not substantially 45° for a right angle reflection, and the actual angle may be selected empirically according to the configuration of the device, or according to predicted characteristics. The surface wave is a wave having vertical and longitudinal components ("VCLW"). In fact, when a VLCW wave is incident on a reflective element, a plurality of shear waves, including higher order horizontally polarized shear ("HOHPS") waves emanate from the reflective array at various angles, the phase velocity differences with respect to the zeroth order mode being related by approximately the square of the order of the wave. Thus, the propagation mode of the HOHPS wave is determined by the angle of the reflective array with respect to the angle of VLCW. Thus, a number of modes may be obtained, each having particular properties which may be selectively exploited. Undesired modes are eliminated by physical and/or electronic filtering and design which is not sensitive to otherwise interfering wave modes. According to the present invention, HOHPS waves having mode 4 or 5 are preferred, although other modes may be employed.

When waves are not directed along a predefined optimal path, e.g., nonselected shear wave modes, they generally have a longer path length before eventual return to the transducer. Thus, nonselected modes will tend to not interfere with the reception of the selected modes because they do not return within the critical time window and are attenuated with time and with a large number of reflections.

According to one aspect of the present invention, a system is provided which includes a transducer which generates a VLCW wave, which is transformed into a HOHPS wave, in a relatively thick substrate, at an angle normal to the direction of VLCW propagation. After traversing the substrate as a HOHPS wave, either once or twice with an intervening reflection, the acoustic vibration is converted back into a VCLW, propagating normal to the HOHPS wave. This system has approximately the same acoustic attenuation for a touch as a comparable shear-shear-shear system with one-half the substrate thickness. This is due to the greater proportion of the wave energy at the surface of a HOHPS as compared to a zeroth order shear wave, thus increasing the fractional absorption to the same degree. The present VCLW-HOHPS-VCLW system is relatively insensitive to water droplets in the active region of the substrate, as compared to a known VLCW mode active region sensor.

Of course, the present invention also includes within its scope other wave modes transmitted to the reflective arrays, which may selectively produce HOHPS waves in the active region, e.g., Lamb waves. Also within the scope of the present invention is the use of Love waves of the lowest order or higher orders in place of HOHPS waves.

Separate Transmitter and Receiver

In one embodiment according to the present invention, the substrate includes a first array of reflective elements for producing a shear wave along the first parallel path portions directed to a second array of reflective elements disposed on an opposite side of the substrate. This shear wave is produced by directing a wave having vertical and longitudinal components, in particular orientation with respect to the array. This orientation shall herein be referred to as the axis, although it should be understood that the axis of wave transmission need not correspond identically to a mechanical axis of symmetry of the reflective array. The first array of reflective elements is disposed on an axis of wave transmission from a first transducer that imparts a wave having vertical and longitudinal components into the substrate. Likewise, the second array of reflective elements is disposed on an axis of wave receptivity from a second transducer that receives the wave having vertical and longitudinal components to provide a signal representative thereof, from which the position of a touch may be determined.

Reverse Reflection

In another embodiment, an array of reflecting elements is provided for reflecting a wave having vertical and longitudinal components ("VLCW") as a higher order horizontally polarized shear wave through a region of the substrate to an array of reflective elements on the opposite side of the substrate. Also provided are reflecting means including a first reflective edge positioned adjacent to the first array and a second reflective edge positioned adjacent to the opposite array. The reflective elements of the first array reflect the VLCW as a shear wave onto the first reflecting edge which in turn redirects the shear waves across the substrate through the second array of reflective elements to the opposite reflective edge. The second reflective edge redirects the waves into the adjacent second array which in turn converts the shear waves to VLCW waves directed to a receiving transducer. The reflective elements of each array are rotated by 90° with respect to a direct reflection system, to redirect the waves onto their respective adjacent edges.

This reverse reflection configuration enables a mode selective filter, as described below, to be placed outside the touch sensitive area between the reflective arrays, and between an array of reflective elements and an adjacent reflective edge, in order to improve the wave mode selecting ability of the device. Of course, the reflective edge itself may serve as part of the mode selective filter. The mode selective filter is preferably spaced precisely parallel with respect to the reflective array to reinforce the correct mode.

It is noted that, in this embodiment, a portion of the wave is redirected back toward the transducer by the second pass through the reflective array, which, in turn may allow spurious wave energy to be further reflected into the active region of the device by the reflective array. Means to suppress interference from this out-of-time signal include reducing reflector strength sufficiently to suppress higher order scattering processes and deviations from a 90° scattering angle.

Combinational Transmitting and Receiving Transducer

In another embodiment, the reflecting means includes a single array of reflective elements disposed along an axis perpendicular to the side of the substrate on which a transducer is mounted, i.e., the axis is aligned with the axis of propagation of a wave emitted from the transducer. The substrate has a reflective edge, the reflective edge being positioned opposite to the array of reflective elements. The reflective elements reflect a surface acoustic wave emitted by the transducer as a higher order horizontally polarized shear wave to the opposite edge of the substrate, which in turn reflects the shear waves of essentially the same mode as the incident wave back to the reflective array. The reflective elements of the array, in turn, convert the reflected higher order shear waves propagating from the reflective edge of the substrate as waves having vertical and longitudinal components, back to the transducer which, upon sensing the reflected waves, produces a signal representative thereof. One transducer to transmit and receive wave having vertical and longitudinal components may be provided for each axes for which a touch coordinate is to be determined.

Triple Transit System

Alternatively, a single transducer may be provided for transmitting and receiving a wave having vertical and longitudinal components that propagates on two coordinate axes, wherein a means is provided that intersects both axes for reflection of a wave propagating along the first axis to the second axis and visa versa. Shear waves reflect off of edges of the substrate with minimal appreciable loss of energy, i.e., the reflectivity of shear waves is high in efficiency, however, a VLCW wave suffers significant losses on reflection and signals are also attenuated according to distance travelled. Therefore, such a single SAW transducer design is less preferred than multiple transducer designs. In addition, with a single transducer design, the longest wave path of the first axis must be shorter than the shortest wave path of the second axis. Generally, this means that the transducer must have a length along the first axis greater than the length along the second axis, in order to avoid superposition of waves travelling along the first and second axes.

Substrate

The sheet-like substrate is preferably glass (perhaps tempered or frosted), plastic, metal or ceramic, most preferably 0.090" thick transparent soda-lime glass. It is generally preferred that the substrate be transparent for use in front of a display device. In circumstances where transparency of the substrate is not required, i.e., where the sensor system is not employed as a touch screen in front of a display, a metal or ceramic substrate may be employed.

The substrate may further be formed as a flat plate, or may be curved along one or both axes as a cylindrical, spherical or ellipsoidal section, or may have other configurations. In these non-flat embodiments, due to the three dimensional geometry the normal condition will not necessarily be a wave which propagates normal to the transmission array, and the desired angle of propagation may actually vary between portions of the array. Thus, the angle of the elements of the reflective array need not all be parallel, and may be altered to achieve a desired functionality. Likewise, the axis of propagation of wave components may be altered in flat substrate embodiments to achieve a desired configuration.

It is noted that other substrates may be used for acoustic touch sensors. In fact, borosilicate glass provides certain advantages, including up to approximately 30 dB increased signal-to-noise ratio over soda-lime glass for a Rayleigh mode system. It is believed that an increase in signal to noise ratio will also be apparent in shear mode wave sensors, of zeroth order and higher.

One advantageous embodiment of the present invention provides a borosilicate glass substrate with a frosted rear surface for use as a projection surface for a Texas Instruments digital micromirror device ("DMD") image projector and touchscreen sensor. Of course, other image projection technologies, such as LCD and CRT technologies may be employed.

A glass substrate may be tempered, although a glass frit may not be used to form surface features and the like, such as the reflective elements or filter elements due to the high temperatures involved in curing the frit, which are above the annealing temperature of the glass substrate.

Shear Waves

As shown in FIG. 2B, the shear wave 12 imparted into the substrate 10 by the reflecting array is not confined to a single surface of the substrate 10, but extends throughout the entire thickness of the substrate 10. Various modes are produced, and the system preferably produces significant energy in waves having at least one horizontal nodal plane through the substrate. Due to the differences in phase velocities, these waves emanate at different angles from the reflecting array. As is characteristic for shear waves, the particles of a wave propagating in the X direction move only in the Y direction. It is noted that shear waves may be symmetric or antisymmetric about the median plane. As noted above, the reflective array produces a plurality of shear wave modes, which are dispersive. A desired mode is selected by the configuration of the device. More particularly, these modes follow the following plate solutions for a wave traveling in the X direction.

$$Ux=0$$
$$Uy=A \cos(2\Pi nz) \exp [2\Pi i\ (x/\lambda_n - ft)]$$
$$Uz=0 \quad \text{Eq. 1}$$

where Ux, Uy, Uz are displacement components in the x, y and z directions respectively, A is a constant, n is the mode, $\lambda$ is the wavelength, and f is the number of cycles per second. These shear waves are designated herein as the horizontally polarized shear waves.

According to the present invention, the acoustic reflectors are provided which selectively direct acoustic power of a desired acoustic mode in a predetermined direction during the reflection process, based on the different phase velocities, $\lambda_n \cdot f$, of the respective modes. Therefore, the direction of a desired wave mode requires that wave modes with closely spaced phase velocities to be distinguished. Where phase velocities are too close, parasitic modes will complicate touchscreen signal behavior. It is this effect, in part, which limits known Shear-shear-shear sensor systems to thin substrates. The present system therefore preferably employs desired wave modes which are more easily distinguished from parasitic modes.

The difference in phase velocity between zeroth order shear and the various HOHPS is approximately proportional to $(n/t)^2$, where n is the order of the mode and t is the thickness of the glass. The phase difference between n=0 (zeroth order shear) and n=1 mode decreases as $(1/t)^2$ as t increases. Therefore, by increasing n, thick glass may be used while still allowing the reflective arrays to cleanly separate out a single desired mode. It is noted that for thicker glass, the phase velocity difference between n=0 and n=1 may generally be too small to cleanly separate. However, higher orders, especially n=3, 4 and 5 may be more easily separated from each other. It is noted that, in a thinner substrate, e.g., 0.040" thick, the higher order modes above about n=4 are not supported. In this case, it is preferred to employ lower HOHPS wave orders, e.g., n=1 or 2.

In addition to allowing the use of thick glass, the use of HOHPS also provides additional benefits. The zeroth order horizontally polarized shear wave mode differs from HOHPS wave modes in that HOHPS have at least one nodal plane parallel to the substrate surface, while zeroth order shear waves have a quasi-uniform wavefront through the entire thickness of the substrate. All HOHPS have a surface power density equal to twice the power density averaged over the volume of the substrate, while zeroth order shear waves has a constant volumetric acoustic power density which is the same at the surface as the average over volume. Thus, for n>0, more of the shear wave's power is present near the surface. It is this relationship which allows a doubling in substrate thickness used in an n>0 HOHPS sensor as compared to an n=0 shear sensor.

Multimode Sensor

The present system employs acoustic waves, and may operate with a plurality of distinct acoustic wave modes to obtain a single data measurement, in which case various characteristics may be optimally measured through detection of the different acoustic wave modes. Redundant measurements may also be taken by analyzing different acoustic wave modes to analyze the same characteristic. For example, HOHPS waves of third and fourth order generated on the front and rear of the substrate, may be used to redundantly measure the coordinates of a touch. Likewise, a wave having a vertical component will be sensitive to an object in light contact, while the shear wave may have comparatively less sensitivity to this object but also less susceptibility to shadowing by a strongly wave absorbing perturbation on the surface. Thus, multivariate analysis may be used to gain more information or resolve ambiguities in the received signals. The waves need not have the same frequency, and indeed, for different waves to propagate in the same sensor system, it may be advantageous to vary both frequency and wave mode. Thus, the properties of different types of waves may be exploited in a single system.

A multivariate analysis of different parameters may be employed to obtain further information from the received data. If more than one wave type is present, a controller may select an optimal wave or set of waves to analyze the sensed variable. In addition, if a plurality of wave types are available, a wave or set of waves which causes a minimum of interference with other equipment may be selected. Interference may be present, for example, where two like sensor systems are near one another. In this case, if a number of wave types or frequencies are available, the nearby systems may be tuned differently in order to reduce interference. Interference may also be present if nearby equipment radiates or receives frequencies near the operating frequency of the device. Again, the ability to operate at a number of frequencies, or in a frequency hopping mode will make the device more robust and less intrusive in its environment.

Of course, different types of waves may also be time multiplexed, e.g., applied to the substrate sequentially, and therefore need not be present or analyzed simultaneously. However, with a fixed mechanical configuration with a minimum number of transducers, it is preferred that various wave modes be simultaneously applied to the substrate and resolved by selective processing at the receiving transducer or in the receiving electronics. Where the number of transducers is not minimized, active cancellation schemes may be employed.

Where excitation of transmitted waves having differing frequency or wavelength may be independently selected, it is preferred that these be time multiplexed onto the substrate. This is because the time resolution of an acoustic touch sensor is generally much higher than is necessary for the intended usage, and therefore the these measurements need not be accomplished as fast as possible. Separating these measurements in time reduces interference between the measurements and may reduce the computational complexity required of the analysis. Under circumstances where a high speed of data acquisition is desired, or computational power is available for this purpose, multiple wave modes may be analyzed simultaneously.

It is also possible to provide a time varying configuration of the sensor, optimized for differing modes. A time varying configuration requires a mechanical actuator or an electroacoustic device, which are not preferred because of their added complexity, although still within the scope of the invention. Where an active compensation scheme is employed, the compensator may vary with time to help select the desired waveform for analysis with reduced interference.

In an acoustic touch-position sensor, in order to determine the position of a touch on the substrate, the system is designed so that each point on the substrate has a unique or quasi-unique characteristic set of time delays, e.g., due to differing path lengths which the respective waves must traverse between the transmitter and the detecting means, i.e., the receiver. It is preferred that the determination of coordinates be performed with identical-type waves, although waves having differing modes may be used to detect position along two or more different axes. For example, in a highly elongated substrate, it might be preferable to employ differing modes or position detection systems to detect position along a length axis and a width axis. Further, a diagonal axis may also be employed, provided with the same or differing mode of wave propagation.

Elongated substrates may be useful, for example, in elevator controls, home appliance controls, keyboard arrangements, and certain industrial controls. In the case of elongated substrates, a shear wave used to sense touch along the longer axis will be less susceptible to shadowing by contaminants than VLCW waves. Thus, for elongated substrates, the use of differing wave modes may be advantageous along different axes.

In circumstances where environmental factors, such as water droplets on the substrate, may interfere with the transmission of one mode of wave propagation, e.g., quasi-Rayleigh, a multiple wave mode system may be provided which has a differing susceptibility to various interfering factors. In this instance, the substrate is selectively excited with two or more differing waves. For example, a so-called Rayleigh-Rayleigh-Rayleigh system, in which quasi-Rayleigh waves are generated by a transducer, reflected across a substrate as quasi-Raleigh waves, and reflected to a receiving transducer as quasi-Rayleigh waves, may be used in conjunction with a so-called Rayleigh-shear-Rayleigh system in which a quasi-Rayleigh wave is generated by transducer, reflected across the substrate as a shear wave, and reflected to a receiving transducer as a quasi-Rayleigh wave. In this instance, the transducers for the Rayleigh-Rayleigh-Rayleigh system may reside on a front, touch sensitive, surface of the substrate, while the transducers for the Rayleigh-shear-Rayleigh system may reside on the rear surface of the substrate. Since the shear wave has energy density through the entire thickness of the substrate, it is sensitive to touch on either surface of the screen, and the placement of the reflective array for this mode on the rear of the substrate does not prevent its operation. Alternatively, the SAW-SAW-SAW system and SAW-shear-SAW system may be provided on the front surface of the substrate, having reflecting arrays which are placed parallel to each other. Preferably, the reflecting arrays are superposed, and the waves propagate through the reflecting arrays in antiparallel directions for each system, allowing the placement of the receiving transducer to distinguish the source of the signal.

Under certain circumstances, it may be possible to time-division multiplex a system to operate in two different modes with the same mechanical configuration. This may be effected by, for example, changing the operating frequency of the transducers so that the ratio of phase velocities of the incident wave to reflected wave is nearly identical and the wavelengths are close. Thus, a single set of transducers is provided for both wave modes. For example, a Rayleigh-shear-Rayleigh system may be excited at about 5 MHz, with a linked Rayleigh-Rayleigh-Rayleigh system operating at 6 MHz. The reflecting arrays for each respective system are superposed. The frequency difference between the modes facilitates filtering of interfering signals, and allows selection of mode merely by changing the excitation frequency of the transmitting transducer.

Likewise, a shear-Rayleigh-shear system may be used in conjunction with a Rayleigh-shear-Rayleigh system, allowing dual mode operation with a single set of reflective arrays. A preferred shear mode transducer is an edge mounted piezoelectric crystal, which may be the entire thickness of the substrate or even larger, to excite a zeroth order shear wave, or a partial thickness transducer mounted near the top surface of the substrate and poled to produce both shear and thickness motion, which would tend to produce zeroth order shear, HOHPS, and Raleigh-type waves, the distribution depending on the resonant frequency of the substrate and the exciting frequency of the transducer. Thus, a single transducer may excite differing waves.

It should be noted that the different modes of operation need not be Rayleigh-Rayleigh-Rayleigh and Rayleigh-shear-Rayleigh, and in fact may be, e.g., Rayleigh-HOHPS(n=3)-Rayleigh and Rayleigh-HOHPS(n=4)-Rayleigh, or other combinations. In general, the systems may use a single set of dual mode transducers, transducers on front and rear faces of the substrate, or dual transducers operating on the same face of the substrate. In addition to detecting the signal for the designated mode system, by providing two different modes of operation, the systems may also detect conversion of a wave from one mode to another mode. This wave conversion mechanism provides a positive signal response, as discussed below.

When a highly absorptive spot of contamination occurs on the surface of the substrate, the substrate my be "shadowed", and insensitive along the X and Y axes through the spot. This may be remedied by providing two different waves which propagate at angles to one another. For example, a first system may operate at 0 and 90 degrees, while a second system may operate at 45 and 135 degrees. This may be provided by superposing on the reflective arrays a second and third reflective array, so that the reflected waves from the first, second and third arrays are directed at, respectively, 45, 90 and 135 degrees. For example, four transmitting/receiving transducers are provided at the corners of a rectangular substrate. The angled waves are detected by transmitting from one transducer and receiving signals from the remaining transducers. Thus, with four transducers, two sets of orthogonal coordinates may be obtained, allowing operation even if an absorptive spot shadows waves passing directly through it. Of course, the arrays need not be superposed, and may occupy both faces of the substrate or be designed to operate at different frequencies and/or with differing wave modes.

Where a plurality of wave modes are substantially present in the substrate, these will likely have different reflection characteristics. For example, a VLCW derived from an undesired shear wave mode will likely propagate in the substrate along a different axis than the desired wave mode. Therefore, the distance from the reflecting array to the receiving transducer may be increased in order to increase the spatial separation of the waves and therefore the selectivity of the transducer. In such a case, both the desired and the undesired waves may be separately received. Thus, the substrate may be modified with acoustic wave conducting extensions to allow spatial separation of wave modes while maintaining a desired form factor.

The signal from the receiver for the denominated undesired wave may be used to separately provide information regarding the touch characteristic, provide a basis for active compensation of the system to improve performance, or to provide data for interpreting the signal from the transducer receiving the denominated desired wave. It is noted that, under certain circumstances, the desired wave and the undesired wave may reverse, and the undesired wave may provide primary information for the output of the system.

Positive Response Sensor

In a further embodiment, a first wave mode propagating in the substrate is transduced to a second wave mode due to a perturbation of the wave, by, e.g., proximity of an object. Therefore, an asymmetric system may be provided in which a selective detector for this second wave mode is provided, resulting in advantages due to increased signal to noise ratio, differential interference effects, ease of detection or filtering, or other advantages. Active filtering, e.g., by emission of an acoustic signal into the substrate with an intended compensatory effect on a signal received by the receiving transducer, or post transduction electronic cancellation techniques may be used to accentuate this new wave mode for easier detection. Since a transducer is often optimized for a particular operating mode, it may be appropriate to employ separate transducers for transmitting and receiving. Active or passive compensation schemes may be provided with separate transducers, which may differ in type and/or location from the primary transducers.

HOHPS waves are subject to change in wave mode due to perturbing influences, such as touch. Therefore, a touch may produce a new waveform, having a different wave order and/or a redistribution of energy components. The transformed wave tends to include a component having the same axis of propagation as the incident wave, and therefore may be received by a receiving reflective array which is the same or parallel to the transmitting reflective array, and redirected to a receiving transducer in a manner analogous to a system which measures signal attenuation. For example, a touch on one side will locally attenuate the wave, possibly in non-uniform fashion with respect to the substrate thickness dimension, creating an asymmetric wave component in the substrate. The transformed wave will tend to propagate in the same direction as the incident wave, and therefore may be received by the receiving system reflective array, and redirected to the receiving transducer in a manner analogous to a system which measures only signal attenuation.

The receiving reflective array may be optimized for a wave having a different wave order, i.e., that which is produced by the touch. In particular, this optimization may be effected by determining the correct reflective element angle for the received wave, which will likely be different from the angle of the reflecting elements of the transmitting array. Thus, according to this embodiment, a positive signal response above a baseline from a perturbation of the sensor, rather than an attenuation in signal response as seen in a signal attenuation response measuring system, will be received for analysis. This may allow a higher signal to noise ratio with simplified electronics. Of course, such a positive response system may operate in conjunction with an attenuated response system, tuned to the transmitted wave, as a dual mode sensing system. Thus, a dual mode sensor employing a transmitted quasi-Rayleigh wave, with reflective elements angled at 52°, to send a n=4 HOHPS wave across the substrate, may be provided. A touch in the active region converts a portion of the n=4 HOHPS wave into an n=3 HOHPS wave, directed in the same direction as the n=4 HOHPS wave. The receiving reflective array is provided with a proximal reflector, e.g., a surface feature such as an inscribed notch or a raised element or series of linear elements perpendicular to the path of the wave, which will selectively reflect the n=4 HOHPS wave back to the opposite reflective array for reception by the combination transmitting/receiving transducer. Distal to this selective reflecting portion of the array, reflective elements are provided at an appropriate angle for selectively converting the n=3 HOHPS shear wave to a VLCW propagating along a single axis in a separate receiving pathway. Thus, thus system receives both the attenuated n=4 HOHPS wave, as well as a positive response signal from the induced n=3 HOHPS shear wave.

Alternatively, another embodiment of the invention, for which the above embodiment is a special case, provides a positive response system provided with an incident even (possibly zeroth) order horizontally polarized shear waveform in the active area of the sensor. This even order shear wave is converted by touch, through an local absorption of surface wave energy, to a HOHPS wave of odd order, as well as possibly other even wave orders. Thus, standard methods may be used to create a zero order horizontally polarized shear wave, while a receiving system as described herein for an odd HOHPS wave is employed. It is noted that for the purposes of a simple positive response system, the incident even order shear wave need not be "pure", so long as the spurious HOHPS waves are eliminated or fully compensated, as the receiving subsystem may separate all interfering wave modes from the desired odd HOHPS wave. The roles of even and odd modes here can be reversed.

Use of an active mode-converting stylus extends the possibilities, including shear-to-quasi-Rayleigh positive signal sensors.

Reflective Elements

When a Rayleigh wave or other wave having vertical and longitudinal components, i.e., zeroth order symmetric or antisymmetric Lamb waves, higher order Lamb waves, travels along an array of reflective elements, portions of the wave energy may be reflected by these elements. The characteristics of the various reflections depend on the type of reflectors and their characteristics, spacing and angle, the substrate and its parameters, the incident wave characteristics, as well as overall other system characteristics which are not fully understood. In general, however, a set of parameters may be found at which, under standard conditions, in an approximately 0.090" soda-lime glass substrate, a quasi-Rayleigh wave of frequency of about 5.53 MHz, directed at a reflective grating composed of a silkscreened glass frit, having a width of 0.01" and a spacing of 0.022", at a predetermined angle, being more than 45° from the axis of the transducer, directs third or fourth order horizontally polarized shear waves normal to the axis of the transducer. Other wave modes, under these same circumstances, will be directed at different angles, possibly in a grossly non-coherent fashion, and will tend not to substantially interfere with the touch sensitivity nor produce a significant interfering signal at the receiving transducer. Parameters of other usable embodiments may be selected according to the teachings herein.

In general, it is seen that by selecting the characteristics of the touch sensor for use with higher order horizontally polarized shear waves, a relatively thick homogeneous substrate may be employed, with good touch sensitivity yet without undue sensitivity and with reduced shadowing effects. Because these waves are selected by varying the angle of the elements of the reflective array, the construction details are well understood and employ minor modifications to existing methods of production.

When the spacing of the elements is an integral multiple of the wavelength of the wave in the medium, the reflections from neighboring reflectors will be coherent, i.e., in phase.

The angle of the reflective elements of the array of reflectors, used to convert surface acoustic waves to or from shear waves, must also be selected to perform coherently to direct a selected wave mode in phase between the transducer and the active area of the substrate. Thus, the reflective array serves as a selective filter for the selected and directing the desired wave mode. The reflective array may be combined with other filters, which may be applied as is standard in the art to select the desired wave propagation mode. While these filters are generally passive filters, active filters are also included within the scope of the present invention. Further, the receiving transducer itself may be designed to selectively receive the desired signal by passive or active means.

In a preferred embodiment according to the present invention, a piezoelectric transducer produces an excitation signal at about 5.53 MHz, which propagates as a quasi-Rayleigh or Lamb wave along an axis. The quasi-Rayleigh wave mode is insensitive to touch on the rear surface of the substrate. This transducer may be of conventional type. Along this same axis, and outside of an active region of the substrate, a series of closely spaced parallel interruptions are formed, at an angle more than about 45°, e.g., about 47°–57° from the axis of propagation. The spacing of these interruptions will be about an integral number of the wavelength of the quasi Rayleigh or Lamb wave. The configuration, especially the angle of the reflective elements, is preferably selected to deflect a fourth order horizontally polarized shear wave at right angles to the axis into the active area of the sensor system. The substrate is preferably a 0.090" thick piece of soda-lime glass, which may be formed easily and is strong enough not to require optical bonding for mechanical strength.

It has been found that the optimal chevron angle from the axis of propagation of the VLCW for a shear wave of n=0 or n=1 is about 47°–48°, n=2 is about 48°–49°, n=3 is about 50°, n=4 is about 52°–53°, and n=5 is about 56°, for glass thicknesses of 0.085" to 0.090" with increasing thickness tending to smaller angles. The ratio of the phase velocity of a quasi-Raleigh wave and an n=4 HOHPS is about 0.77.

It is noted that the selected wave mode need not propagate at an angle normal to the axis of the transducers, and indeed may be directed at a various other angles. In fact, as stated above, intrinsic to the present design, various wave modes are directed at different angles. However, the configuration of the device selectively detects a perturbation of a selected wave. Therefore, a single transmission array may produce a plurality of waves having different modes, which are selectively received by a plurality of receiving transducers, optionally associated with a plurality of receiving reflective arrays. These receiving arrays may be superposed, parallel, on opposing sides of the substrate, or in other arrangements.

When the reflected angle of propagation is not at right angles to the VLCW axis of propagation, it is preferred that the edges of the substrate under such circumstances either be non reflective for the wave or be formed to reflect the wave in the desired direction of propagation while maintaining the generally rectangular shape of the substrate, by, e.g., angled facets in a sawtooth arrangement. These facets may also vary in thickness. Such facets may have right angle tips, angled to present facet edges which are parallel and direct the wave in the desired direction, and staggered along the axis of reflection by a distance which provides the reflected waves in an in phase condition. The facet reflective faces may also be placed at another angle to the incident wave, in order to selectively direct waves in a desired manner. Since a straight substrate edge parallel to the reflective array will tend to reflect the shear wave along the incident path, a non-straight edge condition may be provided to optimize the system for a non-rectangular signal path. The edge may therefore assume a serrated condition. Where the waves are desired to be reflected along a non-rectangular path, the substrate and reflective arrays are preferably designed to multiplex the desired signal for reception by a single transducer without substantial interference or artifact.

It is desired that the detection sensitivity be relatively even over the entire active sensing area of the substrate. When a reflecting array is provided with identical repetitive reflecting elements at uniform intervals, the waves with the shortest signal path will have a substantially greater intensity than the waves with the longest signal path. This is because of the effects of simple attenuation by transmission through the substrate, as well as the fact that a reflective array of uniform design will tend to reflect a constant proportion of the wave energy at each element, thus causing an substantially exponential decay in signal strength with increasing distance from the transducer. It is therefore preferred that this exponential decay be compensated, e.g., by varying the reflected proportion of the signal with increasing distance from the transducer, to compensate for one or both of these effects. The touch sensitivity will be somewhat related to the power density of the acoustic wave in the region of the touch. Thus, a somewhat constant power density is preferably provided to the entire intended touch sensitive region of the substrate. A constant power density reduces the required dynamic range of the receiving system for analysis of the received signal.

One way of providing a constant power density of the surface acoustic waves, reflected by the arrays, is to employ a "reflective element withdrawal" method, as discussed in U.S. Pat. No. 4,644,100 and U.S. Pat. Re. No. 33,151. This method increases the power reflectivity at points along the array as the distance between the points along the array and the respective transducer increases. The "reflective element withdrawal" method is such that selected reflective elements in the array are eliminated. To avoid large gaps between reflectors, the "reflective element withdrawal" method can be applied to sub-segments of individual reflections.

Another method of obtaining constant power density include increasing the power reflectivity at points along the array as the distance of the points along the array from the respective transducer increases, by providing a variable height reflective array is provided as shown in FIG. 4. Such reflecting elements of reflective arrays having varying height are known, see U.S. Pat. No. 4,746,914, incorporated herein by reference. The height of each element in the reflective array is such that the power reflectivity per unit length of a reflective array, σ(x) is approximately given by the following (neglecting multiple reflection effects, radiation spreading, absorption in the substrate, etc.)

$$\sigma(x)=\alpha[(1+\alpha/\sigma_L)\epsilon^{\alpha(L-x)}-1] \quad \text{Eq. 2}$$

the ratio of the height of the array at x to the height of the first array element (x=0) is approximately $$h(x)/h(0)=[[(1+\alpha/\sigma_L)\epsilon^{\alpha L}-1]/[(1+\alpha/\sigma_L)\epsilon^{\alpha(L-x)}-1]]^{1/2} \quad \text{Eq. 3}$$

the ratio of the heights of the last array element and the first array element is approximately $$h(L)/h(0)=[[(1+\alpha/\sigma_L)\epsilon^{\alpha L}-1]/[\alpha/\sigma_L]]^{1/2} \quad \text{Eq. 4}$$

where α represents the power absorptivity of the array per unit length, x is a variable representing the distance from the start of the array and L represents the length of the array. To design a variable height array, a practical value for the ratio of the maximum to minimum height, h(L)/h(0), is estimated and substituted into equation 4 to determine $\sigma_L$. Thereafter the values of h(0) and $\sigma_L$ are substituted into equation 3 to estimate the height of the array as a function of distance. The resulting sensor substrates are then empirically tested to allow optimization of the substrate to account for the other variables.

With reflector withdrawal method or variable height arrays, the waveforms shown in FIG. 8 are obtainable wherein the amplitude of the HOHPS waves as reflected by the array elements is maintained substantially constant across the array in the absence of a touch.

It is also possible to screen arrays on both the top and bottom surfaces of the substrate, provided that the top and bottom reflective elements are aligned so that the desired mode is reinforced and other modes are suppressed or better distinguished.

Laminate or Full Depth Structures

Spurious wave modes may be suppressed by forming the reflective elements of the arrays in such a way that the elements extend through the thickness of the substrate so as to minimize the amount of spurious modes for a given HOHPS mode reflectivity. Both HOHPS and Rayleigh waves have phase variations through the thickness of the glass. This could be accomplished by etching slits in the substrate to the desired dimensions, and backfilling with glass frit or the like, to create reflective elements that extend through the thickness of the substrate. It is noted that, while the HOHPS has an energy distribution throughout the volume of the substrate, the energy of Rayleigh waves are confined near the surface, and therefore full thickness reflective array is only slightly more efficient than a partial thickness slit reflective array.

A high degree of acoustic transparency of the reflective array is generally desired in order to allow substantial wave energy to reach the distal portion of the reflective array. Waves having a substantial surface energy density are better reflected by surface reflectors. However, if the substrate is a laminate structure, it is also possible to provide a buried reflective array. This arrangement is advantageous if it is desired to have a wave emitted from a transducer which is protected until directed into a sensing portion of the sensor system. Thus, an internal wave, e.g., a Stoneley wave, may be generated and directed internally in a portion of the substrate having a laminated structure to allow propagation in a relatively confined layer of the substrate. The reflected wave is preferably a shear wave, such as a zeroth order shear wave or a HOHPS. Thus, a transducer may generate a wave, which propagates as an internal Stoneley wave, which is protected from external influences. The reflective array, which may be formed by internal strips of material or the raised reflective elements from a central layer, protruding into a laminate, which reflect the Stoneley wave into the active region of the substrate as a shear wave. This shear wave is attenuated at characteristic time delays by touch on the substrate, and the remaining wave power is reflected by corresponding reflectors to a receiving transducer. While this reflected wave may also be a Stoneley wave, as part of a Stoneley-shear-Stoneley sensor system, the twice reflected signal may be of another type, e.g., a Rayleigh wave. The substrate may be, for example, a lamination of two types of glass with acoustic properties that support Stoneley waves at the boundary and Love waves confined mainly in the upper layer. The transducer may be a pressure-mode piezoelectric element generating a vertically propagating pressure wave that couples to Stoneley waves due to a grating pattern placed at the lamination boundary.

The present system also provides for the use of mode specific filters which act analogously to antireflective coatings in optics. Thus, for example, if a fourth order horizontally polarized shear wave is desired to be selected from a plurality of higher order horizontally polarized shear waves, a laminate structure having alternating layers of materials having differing phase velocities for the various shear waves may be placed at a reflective edge of the substrate. Such a laminate is shown in FIG. 17. The laminate has a width such that the desired wave is reinforced, while waves having differing order, angle of incidence or differing phase velocity are attenuated. Likewise, a widthwise stack of such laminates with an intervening partially reflective plane may be employed in a multielement filter. In fact, the entire substrate may be a laminate, which would selectively transmit shear waves of the corresponding order, and lower and higher harmonics thereof. In such an instance, it is preferred that a plastic film of carefully controlled thickness and acoustic transmission properties be laminated alternately with a glass substrate material, to selectively transmit a single higher order horizontally polarized shear wave based on the thickness of the film in relation to the wavelength along the Z axis of the substrate.

A plastic sheet having an optical coating, e.g., a film with an HEA coating manufactured by OCLI, to eliminate or minimize optical reflection may be laminated to the bottom surface of the substrate. Such a plastic coating on the back side of the substrate not only improves the optical qualities of the substrate, but may be used for safety reasons to limit damage due to breakage of a glass substrate. Because this plastic sheet serves a filtering function, its acoustic properties are well controlled, e.g., material, thickness, lamination conditions and other known factors.

Any reflective or partially reflective plane or any spatial change in the phase velocity of a wave parallel to the axis of the transmission of the wave, will tend to filter the wave to selectively transmit certain modes. Further, any layer having varying acoustic properties, such as absorptivity, will also filter the wave and selectively transmit certain modes. A laminate structure need not be symmetric about the median plane of the substrate, and any types of materials which together selectively transmit the desired mode may be used. Other types of three dimensional structures and resonators may also be useful in selecting a desired mode.

In a preferred embodiment, standard safety glass, e.g., automotive windshield comprising 3/32 ≭ glass, 1/32 ≭ polymer adhesive, 3/32 ≭ glass is employed. The frequency of operation of the device is determined by the selected order wave, as well as the mechanical and acoustic properties of the substrate.

In another preferred embodiment, a Love wave, which is a horizontally polarized shear-type wave having wave energy at one surface and substantially less on the opposed surface, is provided. The Love wave condition is facilitated by providing a laminate of two or more substrate materials which differ in phase velocity, with the lower velocity on the top, sensitive surface. The Love wave may have different wave orders, e.g., n=0, 1, 2, 3, ..., in which n is the number of intersecting nodal planes of no wave motion, in analogy to HOHPS waves. In this case, the laminate substrate structure serves a slightly different function than the spatial wave filters described above, and indicates that the sensor arrangements according to the present invention may be employed to select a desired wave class as well as an order within that wave class. The laminate may thus include a larger number of layers, which follow a monotonically increasing pattern of phase velocity change, or be provided with a filter arrangement to particularly select a desired Love wave mode, such as alternating layers of higher and lower phase velocity materials, with an overall asymmetry to select a desired Love wave. Such a layered substrate can be engineered to maximize the difference in phase velocity between the desired mode and the potentially interfering modes nearest in phase velocity.

In a preferred embodiment, a 3 mm thick sheet of borosilicate glass is laminated to a 3 mm thick sheet of soda-lime glass, which captures Love waves of order n=0, 1 and 2. For n=0, the resulting shear motion on the exposed borosilicate surface is about 55 dB greater in amplitude than the shear motion on the exposed soda-lime surface. A 1 mm thick borosilicate glass sheet on a 3 mm thick sheet of soda-lime glass would capture a Love wave of order n=0, only. For this lamination, the n=0 Love mode will have a top-to-bottom shear amplitude difference of about 51 dB. A 2 mm thick borosilicate glass sheet on a 3 mm thick sheet of soda-lime glass would capture Love waves of order n=0 and 1, and the n=0 mode will have a top-to-bottom shear amplitude difference of about 53 dB.

Filtering

As noted above, an active cancellation technique, according to the present invention is one wherein a waveform is applied by a transducer in proximity to the sensor for selectively cancelling, attenuating or compensating the output, thus reducing the necessary dynamic range of the receiving transducer and associated electronics. An active filter system may be based on, e.g., a piezoelectric substrate with driven interdigitations, or a plurality of transducers mounted to the substrate, working in concert to create the desired wave and suppress undesired waves. A related system includes a phased array of transducers.

An active filter system or phased array of transducers generally are used in conjunction with a digital signal processor (DSP) or SAW filter. When a digital signal processor is employed, this device calculates an inverse response from an interfering wave mode and transmits this as a signal to cancel the undesired mode from the received waveform. A SAW filter performs a similar operation in an analog domain as acoustic waves on a piezoelectric substrate. A DSP design may be simply provided with adaptive capabilities, i.e., it may learn new compensation strategies or details and apply these as necessary. SAW filters are less easily modified to adapt to changing conditions than programmable digital devices. It is noted that DSP functionality may be implemented as a dedicated semiconductor design, e.g., a DSP or digital filter, or may be provided as software controlled functionality of a general purpose processor. Suitable DSP devices include TMS320C2x, C3X or C5X devices from Texas Instruments, MC56000 series DSPs from Motorola, Z8 series DSPs from Zilog, etc.

Active filtering may be provided integral to the transmitting and/or receiving transducers, or may be provided through a separate transmitting transducer.

A passive filtering function may also be implemented, which relies on a model of the sensor device, and the receiving transducer optionally with a separate compensating transducer system, which seeks to reduce interference and accurately detect the characteristics of a perturbation of the wave, i.e., the position of a touch. This passive filter may be adaptive, and may be implemented in a DSP, digital filter or other computational system.

The use of complex filters to compensate for resonances, nonlinearities, various reflection modes, and other disturbances allows analysis of a signal which includes primarily the effects of the perturbation. Thus, the filter compensates for the background and characteristics of the sensor itself, passing through information relating to the perturbing influence for specific analysis and output.

Mode Differentiating Physical Filters

In principal, a filter for selecting various wave modes may be implemented in a number of ways. These may be high pass, low pass, band pass or complex transfer function designs. First, undesired wave modes may be absorbed and their energy dissipated in a transmissive or reflective filter. Such a filter may include, for example, substrate portions which do not support shear mode wave transmission or a reflector arranged such that a forbidden reflective mode would be required. Second, a filter may include a semireflective element which passes one component and reflects a second component. The undesired component is thereafter specifically dissipated or ignored in the later signal analysis of the desired component. A specific band pass filter may also be provided to select the desired wave mode. These filters may be provided separately or integral to the substrate or transducers.

It is noted that, where the angle of incidence of the desired shear wave on the reflective surface is not 0°, care must be taken to avoid prohibited or forbidden reflection modes, which occur as a consequence of the known wave mechanics. On the other hand, these prohibited or forbidden reflection modes may be used to eliminate undesired shear wave modes.

For example, a reflective edge, either adjacent to the reflective array or opposite the reflective array across the substrate, may comprise a filter for selectively reflecting a desired wave mode and attenuating other modes or reflecting them in another manner. If these undesired modes are reflected, it is desired to provide an absorber for dissipating the energy of these undesired waves. Because the desired and undesired waves are separated, the absorber need not be intrinsically mode selective.

A filter may be employed which differentiates the waves based on phase velocity alone, e.g., a series of reflective elements, similar to the reflective elements of the reflective arrays, which are placed in the path of the shear wave normal to the angle of incidence. Because a shear wave has energy throughout the volume of the substrate, these elements may be placed on one or both surfaces of the substrate.

While a filter may encompass the active area of the substrate, the filter preferably does not diminish the optical qualities of the substrate for use as a CRT touchscreen.

If the undesired propagation modes produce interference with the receiving transducer, and these modes have differing phase velocity or other distinguishable characteristic, then a selective filter may be placed in the path of the wave before it reaches the receiving transducer. In the present instance, significant potential undesired modes will be waves having vertical and longitudinal components, in particular waves having low order (or Rayleigh or low order Lamb). Therefore, a selective filter may be provided as a series of spaced elements placed on the top surface or both surfaces of the substrate to pass the desired wave and attenuate the undesired wave, based on the wavelength, volumetric power distribution and angle of propagation.

A mode selective filter may also be provided by a substrate having a bevelled reflective edge. As the substrate becomes thinner, the cutoff frequencies for HOHPS modes increase. As the "wave-guide" cut off frequency increases, the group velocity decreases. When the substrate is thin enough for the cut-off frequency to equal the operating frequency, the group velocity becomes zero and the wave is reflected. This reflection point differs for differing wave modes, such that the larger the order n of the mode, the further from the edge of the substrate will be the reflection point. An acoustic wave will have enhanced sensitivity to absorbing materials placed in the neighborhood of the reflection point. Such an approach can filter undesired HOHPS modes as well as VLCW modes.

Thus, if an HOHPS of order n is desired, e.g., order n=4, the order n–1 wave, e.g., order n=3 will be the wave with the closest group velocity and causing the most interference. On a substrate with a bevelled edge, an absorptive material, such as a sealant, adhesive or tape, placed distal to the order n=4 reflection point will filter the n=0, 1, 2 and 3 waves. This material may be placed on one or both sides of the substrate. In order to filter the order n+1 wave, a further adsorbent material may be placed proximal to the order n reflection point, which will differentially absorb the order n+1 wave due to the concentration of wave energy and the low phase velocity at that point. Thus, the adsorptive strip on the tapered edge may be interrupted at the location of the reflection of the order n wave.

The bevelled edge concept may also be used to selectively excite and receive HOHPS waves of the desired order at an edge of the substrate, using narrow strip transducers.

The substrate bevelling may take the form of a narrowing facet or tapering on one or both sides of the substrate. This bevelling may also be used in systems with two transducers per axis, one per axis and one transducer for both axes. The bevelling, however, is preferably not provided on edges also having reflective elements, unless the wave is directed in the reverse direction to the adjacent edge for filtering.

Thus, the reflective edge may serve as part of the mode selective filter. This mode selective filter is preferably spaced precisely parallel with respect to the reflective array to reinforce the correct mode and reflect it back along the desired path.

Alternatively, as shown in FIG. 1G, a plurality of receiving elements are provided which allows a spatiotemporal analysis of the waveform, e.g., the receiving transducer comprises an intrinsic selective filter for selectively receiving a waveform of the desired characteristics.

While it is preferred to employ the piezoelectric receiving crystal in compression mode as shown in FIGS. 1C and 1G, a receiving transducer may be mounted flat on the substrate, to produce a useful signal. In this case, it is preferred that a piezoelectric receiving transducer be mounted on a conductive layer, with segmentation or separation of transducer portions accomplished by elements on the upper surface of the transducer. In this case, a series of electrodes are formed on the top surface of the piezoelectric crystal, as shown in FIG. 1H, which is a PZT or lithium niobate crystal, spaced at $\theta_A/2$, or possibly smaller intervals, of the waveform. In the case of a spatial arrangement of transducing elements separated by the wavelength of the wave, alternating electrodes may then be summed, or separately analyzed, to select the desired wave from the undesired waves. When the electrode spacing does not exactly equal one half of the wavelength, the individual electrode elements are analyzed separately.

A VLCW derived from an undesired shear wave mode will likely propagate in the substrate along a different axis than the desired wave mode. Therefore, the distance from the reflecting array to the receiving transducer may be increased in order to increase the spatial separation of the waves and therefore the selectivity of the transducer. In such a case, another transducer may be provided along the other axis to receive information relating to the other wave. Thus, the reflecting array also serves as a physical filter.

Advantages

Thus, touch position sensors according to the present invention may provide some or all of the following advantages:

A higher acoustic absorption for a touch of a HOHPS as compared to a zeroth order horizontally polarized shear wave touch sensor with otherwise identical parameters such as substrate thickness.

A Simplified mounting due to absence of touch sensitivity of the bottom of the substrate to touch in regions where a quasi-Rayleigh wave carries the wave energy on the top surface, so that mounting of the substrate on the rear surface around the edges is possible.

A thick substrate, allowing the use of glass, with lower fragility and increased rigidity, i.e., about 0.090" to about 0.125" thick. Tempered glass is easier to manufacture at these thicknesses. The break strength of a slab is proportional to its thickness squared, while stiffness if proportional to the thickness cubed. Thick glass may be more easily formed, in particular as cylindrical and spherical profiles to conform to the shape of CRT tubes.

BRIEF DESCRIPTION OF THE DRAWINGS

The preferred embodiments of the invention will be explained by reference to the drawings, in which:

FIG. 1A is a perspective view of a prior art surface acoustic wave propagating plate;

FIG. 1B is a greatly exaggerated perspective view of a surface acoustic wave traveling in the prior art plate of FIG. 1A;

FIG. 1C is a side cross sectional view of the prior art plate shown in FIG. 1A illustrating the nature of the waves generated in the plate;

FIG. 2A is a perspective view of a shear wave propagating plate in accordance with the present invention;

FIG. 16 is a top view of a touch position sensor according to an embodiment of the present invention;

FIG. 19 is a perspective view of a fourth embodiment including a Love wave sensor.

DETAILED DESCRIPTION OF THE PREFERRED EMBODIMENTS

Substrate

Figure 2B:
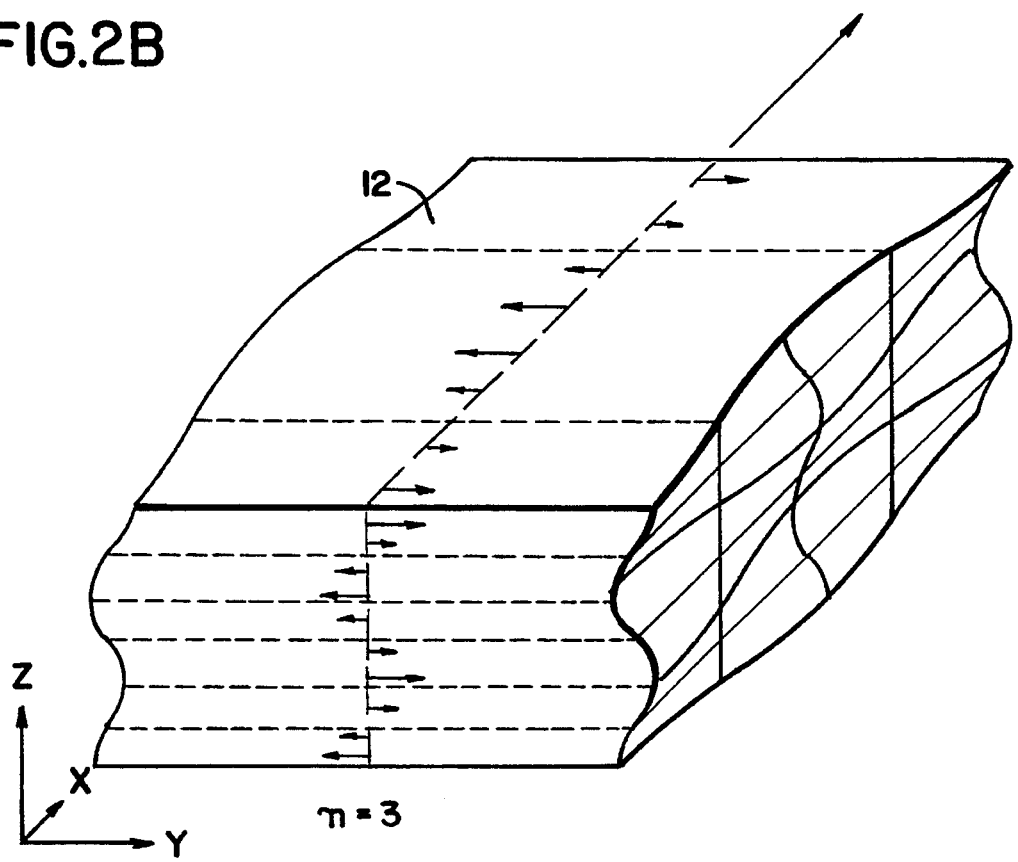
FIG. 2B is a greatly exaggerated perspective view of a shear wave traveling in the plate of FIG. 2A.

The touch position sensor of the present invention includes a substrate 10 that is capable of propagating a shear wave 12 as shown schematically in FIG. 2A. The substrate 10 is formed of 0.090" thick transparent soda-lime glass, formed as a flat plate.

The soda lime glass substrate 10 may be optionally tempered, although a glass frit may not be used to form surface features and the like, such as the array 28 of reflective elements or filter elements due to the high temperatures involved in curing the frit, which are above the annealing temperature of the glass substrate.

Transducer

Figure 1D:
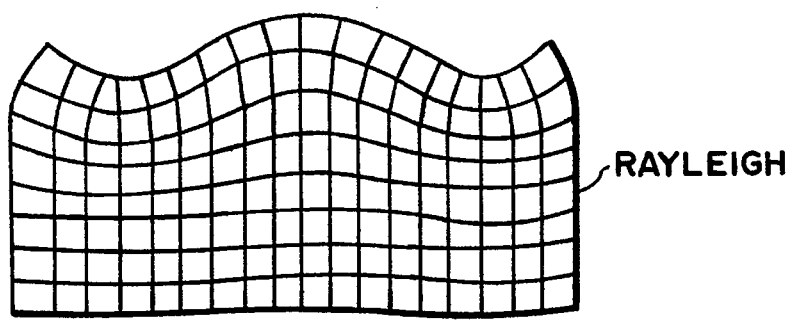
FIG. 1D is an illustration of a Rayleigh wave.
Figure 1E:
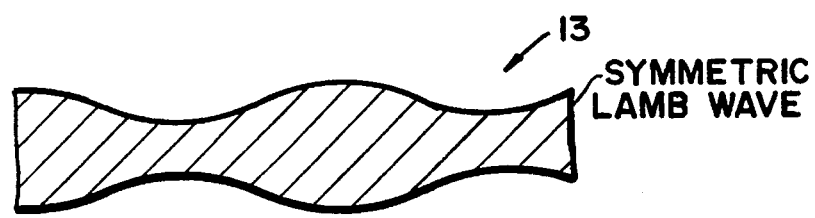
FIG. 1E is an illustration of a symmetric Lamb wave.
Figure 1F:
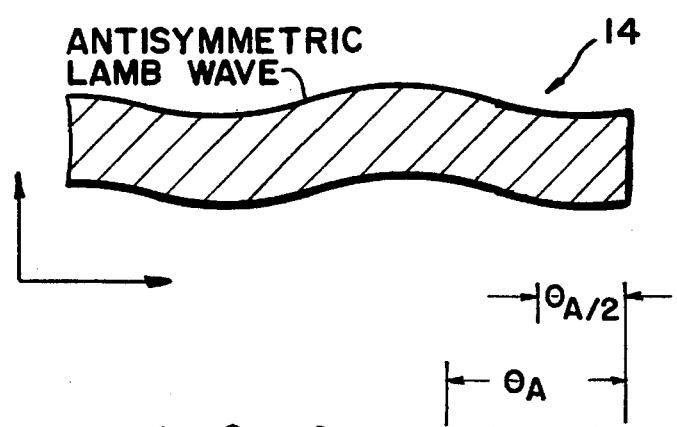
FIG. 1F is an illustration of an antisymmetric Lamb wave.
Figure 1G:
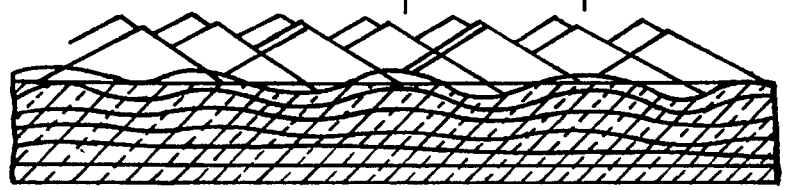
FIG. 1G is an illustration of a multiple element receiving transducer.
Figure 1H:
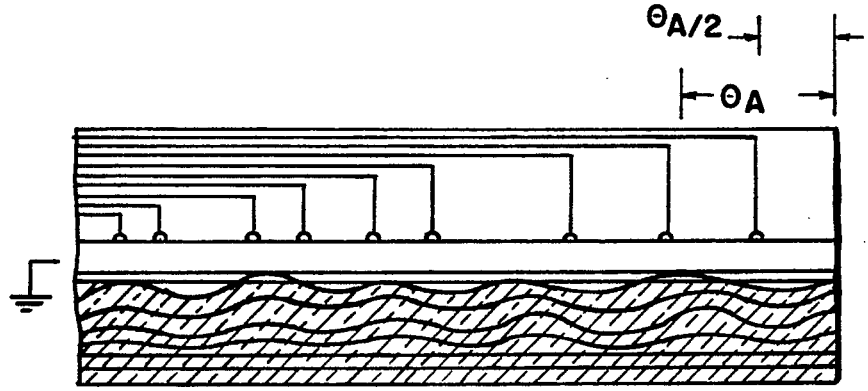
FIG. 1H is an illustration of a receiving transducer having multiple electrodes.

In order to induce a shear wave propagating in the X direction, a piezoelectric transducer 24, as shown in FIG. 1A, is mounted so as to produce a quasi-Rayleigh mode wave, i.e., a wave having vertical and longitudinal components, having the wave energy principally confined to an area near the surface of the substrate, propagating in the Y axis of substrate 10. The transducer 24 is responsive to a drive signal to cause an oscillation, which is conducted to the substrate. This quasi-Rayleigh mode wave is transduced to a shear wave propagating along the X axis by the reflecting array.

As shown in FIGS. 1A and C, surface acoustic waves are transduced, into the substrate utilizing a piezoelectric transducer mounted on a plastic wedge that is in turn mounted on the touch surface of the plate. The transducer vibrates, producing a compression bulk wave which propagates along the axis normal to the interface of the transducer and the plastic wedge. The wave propagates in the wedge, to impart a surface acoustic wave having vertical and longitudinal components, a VCLW, in the substrate. The wedge extends above the plate, and therefore the rear or inactive side of the substrate and its edges remain free of circuitry or critical elements. Further, the area of the substrate in which the wave energy is in the form of Rayleigh or quasi-Rayleigh mode waves is insensitive to mounting on the opposite, inactive surface. The piezoelectric transducer is bonded to the plastic wedge and the wedge with transducer then bonded to the glass touch plate. The piezoelectric element is plated top and bottom with electrodes which allows electrical connection.

Using a simple arrangement comparing the attenuation by a touch of a quasi-Rayleigh as compared to a shear wave, the quasi-Rayleigh wave in a 0.040" substrate was attenuated from 4.8 V to 3.2 V, a 33.3% reduction. A HOHPS shear wave in a 0.090" substrate was attenuated from 1.5 V to 1.4 V, a 6.6% reduction. Therefore, in order to obtain the same sensitivity, the burst amplitude to the transducer for a shear mode system should be about 5 times higher, e.g., +14 dB. It is calculated that for a HOHPS shear mode sensor in a 0.040" substrate, that an increase of about 20 log (0.090"/0.040")=3.5 dB in touch sensitivity is expected. Increased sensitivity can also be obtained by increasing the burst length of the excitation signal.

Reflective Array

A test reflective array having continuously varying reflector angles serves to produce, at various portions of the substrate, distinct shear wave lobes having a sequence of orders propagating perpendicular to the axis of the reflective array. On the other hand, HOHPS of the same order will be directed at a varying angle, corresponding to the angle of the elements of the reflective array. Such a test reflective array serves to allow determination of the optimum reflective element angle for a given substrate design. The various waves may be detected by the signal's response to touches and contaminants applied to the surface of the substrate.

Likewise, a reflective array having fixed reflector angles will act as a linear diffraction grating, directing waves having varying phase velocities at different angles, with the faster phase velocities being directed at more acute angles. Such a design is appropriate for use as a touch sensor.

The reflective array is formed by a series of silkscreened glass frit lines, placed at a 52° angle from the axis of wave propagation. The frit is cured in an oven in a later stage, before the transducers and plastic wedges are applied to the substrate. These lines are spaced at intervals equal to multiples of the wavelength of the transmitted wave. The substrate is then baked in order to fuse the frit. The reflector withdrawal method is used in order to assure uniform reflected power density. The reflective elements are formed on the top of the substrate, with respect to the transducer and the expected direction of touch. Of course, other reflective element configurations may also be used.

First Embodiment of Sensor System

Figure 3:
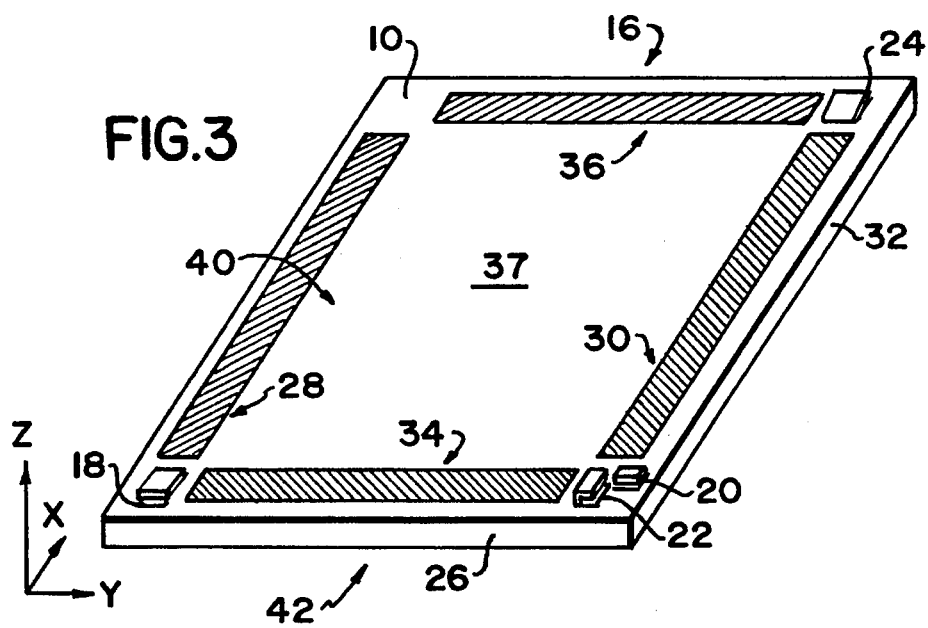
FIG. 3 is a perspective view of a HOHPS mode wave touch position sensor in accordance with a first embodiment of the present invention.

A touch position sensor 16 in accordance with a first embodiment of the present invention is shown in FIG. 3 having a pair of transmitting and receiving transducers 18, 20 and 22, 24 associated with each axis for which a coordinate is desired to be determined. Although the touch position sensor 16 has four transducers 18, 20 and 22, 24 respectively associated with the X axis and Y axis so that both X and Y coordinates of a touch may be determined, if only a single coordinate is desired, for example a coordinate along the X axis, then the transducers 22 and 24 associated with the Y axis may be eliminated. The transducers are plastic wedges having a piezoelectric element with conductive electrodes. The wedges are mounted to the substrate in standard manner with an adhesive, and are aligned so that the piezoelectric transducer produces or receives a compression wave in the wedge, which is transduced to or from a VLCW wave in the glass substrate propagating along the axis of the reflective array.

The transmitting transducer 18 imparts a VLCW that travels along the X axis to an array 28 of reflective elements as described in detail below. Each element of the reflective array 28 is disposed at angle selected so as to direct a particular HOHPS wave across the substrate in a direction normal to the axis of VLCW propagation. This angle of the reflective elements, for a 0.090" thick soda lime glass substrate, is about 52° from the axis of wave propagation. Thus, the reflected HOHPS wave propagates in the Y direction to a corresponding reflective element disposed in a reflective array 30. The array 30 of reflective elements is disposed along an axis that is parallel to the axis along which the reflective array 28 is disposed. Each of the reflective elements in the array 30 is disposed at a corresponding angle to the first array, e.g., about −52° from the axis of propagation with respect to the X axis. The HOHPS propagating in the Y direction from the reflective array 28 is thus converted to a VLCW and directed along the X axis to the receiving transducer 20. The receiving transducer is mounted in conventional manner to the top side of the substrate 10, perpendicular to the axis of the array 30 so as to provide a signal representative of the VLCW.

Similarly, in order to define the Y axis, the Y transmitting transducer 24 is mounted on the top surface of the substrate 10. The transmitting transducer 24 vibrates to impart a VLCW wave that travels along the Y axis to an array 36 of reflective elements as described in detail below. The systems for the X and Y axis are similar. Each element of the reflective array 36 is disposed at about 52° from the axis of wave propagation, so as to reflect a portion of a VLCW wave incident thereto in the X direction to corresponding reflective elements disposed in a reflective array 34. The array 34 of reflective elements is disposed along an axis that is parallel to the axis along which the reflective array 36 is disposed. Each of the reflective elements in the array 34 is disposed at a corresponding angle to that of the transmitting array, about −52° from the axis of the array 34 so as to reflect a VLCW propagating in the X direction from the reflective array 36 to the receiving transducer 22. The receiving transducer 22 is mounted in conventional manner to the top side of the substrate 10, perpendicular to the axis of the array 34 so as to sense VLCW reflected thereto by the array 34 to provide a signal representative of the VLCW.

The reflective elements in the arrays 28 and 30 define characteristic path lengths along the axis of the substrate, such that HOHPS waves reflected by each successive element in the array 28 follow paths to the receiving transducer 20 that are progressively longer, e.g., having a progressively longer time delay.

In present system, according to the preferred design parameters, e.g., fourth order horizontally polarized shear wave propagating in 0.090" soda lime plate glass produced by the float process, with transducers operating at 5.53 MHz, the angle of the elements of the reflective array to the axis of incident wave propagation is about 52° from the axis of propagation, although small modifications to the design details may alter this angle.

Portions of each of the paths defined by the reflective arrays 28 and 30 extend in parallel across the substrate 10 in the Y direction, each parallel path portion defining an X coordinate. Similarly, the reflective elements in the arrays 34 and 36 define a set of paths of differing lengths such that HOHPS waves reflected by each successive element in the array 36 follow paths to the receiver 22 that are progressively longer. Portions of each of the paths defined by the arrays 34 and 36 extend in parallel across the substrate 10 in the X direction, each parallel path portion defining a Y coordinate.

Figure 8:
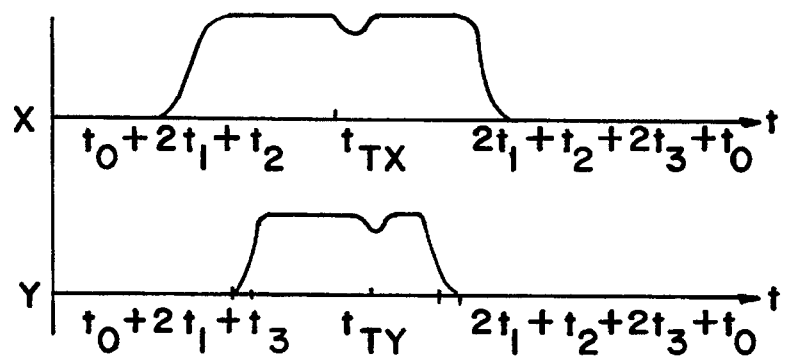
FIG. 8 is a schematic illustration of the X and Y waveforms generated by the touch position sensor of FIG. 3.

The X and Y signals generated by the respective receiving transducers 20 and 22 are depicted in FIG. 8, wherein reflective arrays 28, 30, 34 and 36 of variable height and/or spacing are employed to provide X and Y signals whose amplitudes remain substantially constant with time, as discussed below. With regard to the X axis signal, if a VLCW is generated by the transducer 18 beginning at time $t_0$, the first VLCW received by the transducer 20 occurs at a time equal to $2t_1+t_2+t_0$ where $t_1$ is the time it takes a VLCW to travel from the substrate side 26 to the first reflective element in the array 28 and also the time that it takes the VLCW to travel from the first reflective element in the array 30 to the side 26 where it is sensed by the transducer 20. In the equation, $t_2$ represents the time it takes the selected mode HOHPS wave to travel across the substrate 10 in the Y direction. The HOHPS wave portion reflected by the last element in the reflective array 28 and received by the last element in the reflective array 30 is received by $2t_1+t_2+2t_3+t_0$ wherein $t_3$ represents the time it takes a VLCW to travel in the X direction between the first element of the reflective array 28 and the last element of the reflective array 28 as well as the time it takes a VLCW to travel in the X direction between the last element of the array 30 and the first element thereof. Similarly, if the transducer 24 generates a VLCW at time $t_0'$, the receiving transducer 22 receives the first VLCW reflected by the arrays 34 and 36 at a time $2t_1'+t_2'+t_0'$ and the receiving transducer 22 receives the last VLCW reflected by the arrays 34, 36 at time $2t'_1+t'_2+2t'_3+t'_0$. Each value of $t_x$ between $2t_1 30\ t_2+t_0$ and $2t_1+t_2+2t_3+t_0$ represents a coordinate along the X axis; whereas, each time value of $t_y$ between $2t'_1+t'_2+t'_0$ and $2t'_1+t'_2+2t'_3+t'_0$ represents a coordinate along the Y axis. It is noted that in the preferred embodiment the time at which the drive signal is applied to the Y axis transmitting transducer 24 is at a time subsequent to the application of the drive signal to the X axis transmitting transducer 18 and also subsequent to the time that the X axis receiving transducer 20 receives the last HOHPS wave reflected by the arrays 28 and 30, in order to reduce interference.

A touch on the outer, i.e., top surface 40 or on the inner, i.e., bottom surface 42 of the substrate 10 will absorb a portion of the energy of the HOHPS waves passing in the substrate adjacent to the touched position. This partial absorption of energy creates a perturbation in the HOHPS wave whose energy is absorbed, the perturbation being expressed by an alteration in the amplitude of the signals generated by the receiving transducers 20 and 22. For example, the coordinates of a touch on the top or bottom surfaces of the substrate 10 are represented by the times of occurrence of the perturbations in the X and Y transducer signals depicted respectively at $t_{tx}$, $t_{ty}$ in FIG. 8. The VLCW traveling between the transducers and the reflective arrays will be sensitive to touch on only the top surface, i.e., that surface with the reflective array formed, and a touch in the area of propagation of these waves on the bottom side of the array will not substantially perturb the received waveform, thus facilitating mounting of the substrate.

Control System

The control system for use in determining a touch position using a VLCW-HOHPS-VLCW technique may, in general, be used with existing and known touchscreen control technology. Since the transducers are similar, and the signals transmitted and received by the transducers are also similar, the sensor according to the present invention does not require substantial differences in the controller. However, it is noted that, because of the possibility of interference and multipath reflections, advanced controller design may produce benefits from reduced cost, increased signal-to-noise ratio, increased touch sensitivity, faster response and reduced incidence and severity of artifacts.

Figure 5:
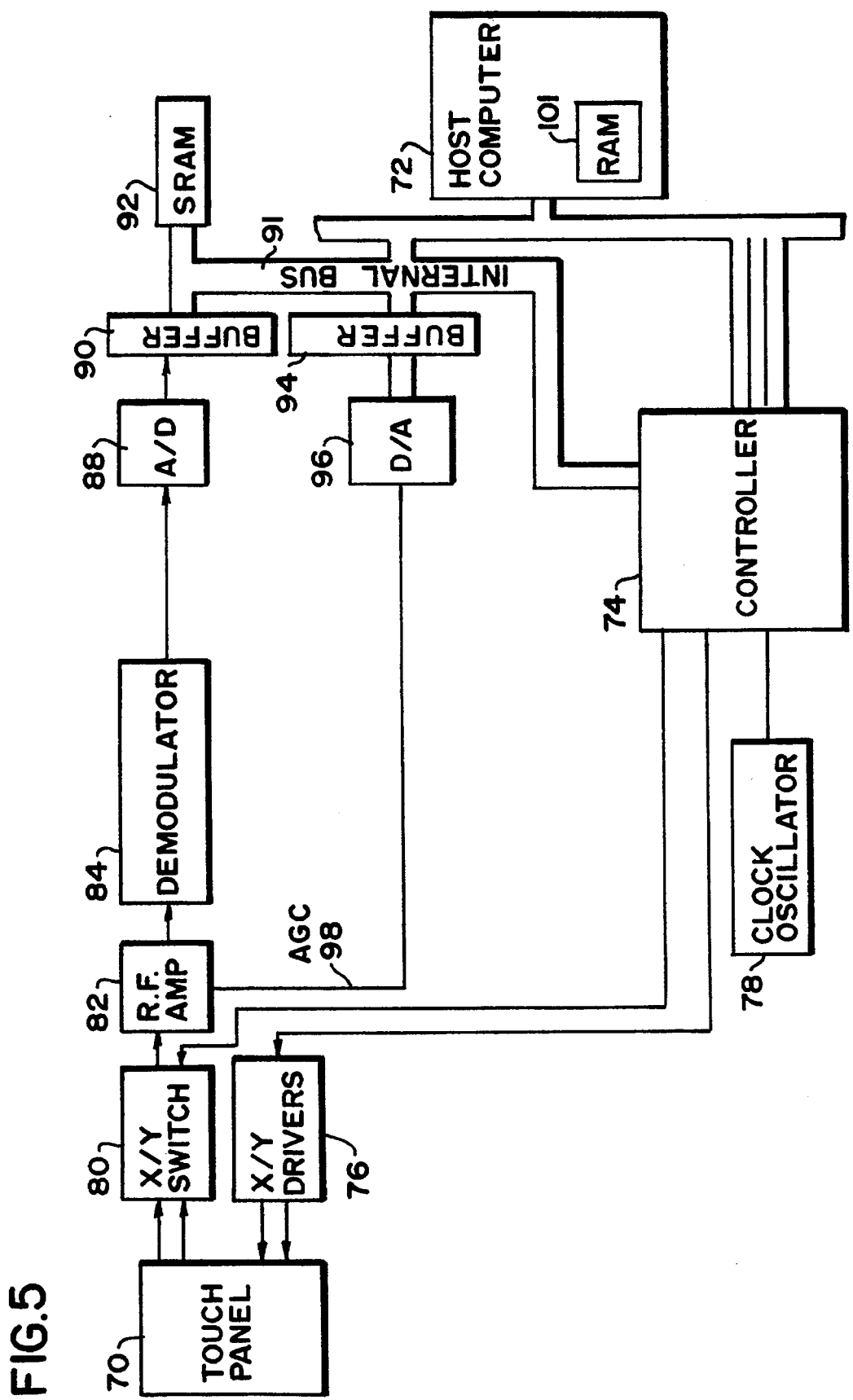
FIG. 5 is a block diagram illustrating one possible implementation of the signal processing portion of the touch position sensor illustrated in FIG. 3.

The control system of the touch position sensor as shown in FIG. 5 is a digital microcomputer system having program instructions stored in a non-volatile memory. This is preferably an 8 bit microcontroller having internal CPU, RAM, counters and timers and possibly other functionality. For example, an industry standard 8052-type microcomputer may be used. Alternative embodiments are also included within the scope of the present invention. The control controls the application of the drive signals to the transducers 18 and 24 and determines the coordinates of a touch on the substrate 10 from the times of occurrence $t_{tx}$ and $t_{ty}$ of the signal perturbations representing the touch. The touch panel 70 as shown in FIG. 5 comprises the substrate 10, the X and Y transmitting transducers 18 and 24, the X and Y receiving transducers 20 and 22 and the reflective arrays 28, 30, 34 and 36. A host computer 72 that may include a microprocessor or the like initiates a scan cycle of the touch panel 70 by instructing a controller 74. The controller 74 is responsive to an initiate scan cycle instruction from the computer 72 to apply a drive signal to the X transmitting transducer 18 through an X driver 76 wherein the timing of the controller 74 is determined by a clock/oscillator 78. The drive signal applied to the transducer 18 is a burst drive signal in the form of a sine wave packet with typically between 10 and 50 cycles. Suitable drive circuits are also described in U.S. Pat. No. 4,644,100 and U.S. Pat. Re. No. 33,151, expressly incorporated herein by reference. The controller 74 also sets an X/Y switch 80 to the X position to couple the X receiving transmitter 20 to a radio frequency-type (R.F.) amplifier 82. As the VLCW reflected by the arrays 28 and 30 are sensed by the transducer 20, the transducer 20 generates an X axis signal representative thereof that is coupled to the amplifier 82 through the switch 80. The amplified X axis signal output from the amplifier 82 is applied to a demodulator 84 that removes the alternating component from the amplified X axis signal to provide an envelope waveform such as depicted in FIG. 8. The output of the demodulator 84 is applied to an analog to digital converter 88, the output of which is coupled by a buffer 90 to an internal bus 91. The controller 74 stores the digital data output from the analog to digital converter 88 in a static RAM 92 (random access memory) such that a value representing the amplitude of the X axis signal at each point in time $t_x$ as sampled by the analog to digital converter 88 is stored in a location in the static RAM 92 representing the point in time.

After the X axis data is stored in the static RAM 92, the controller 74 controls the Y driver 76 to apply a burst drive signal to the Y axis transmitting transducer 24 of the touch panel 70. The controller 74 also changes the state of the X/Y switch 80 so that the Y receiving transducer 22 is coupled to the R.F. amplifier 82. The digital data representing the Y axis signal as output from the analog to digital converter 88 is likewise stored in the static RAM 92 such that a value representing the amplitude of the Y axis signal at each point in time $t_y$ as sampled by the analog to digital converter 88 is stored in a location in the static RAM 92 representing the point in time.

Figure 9:
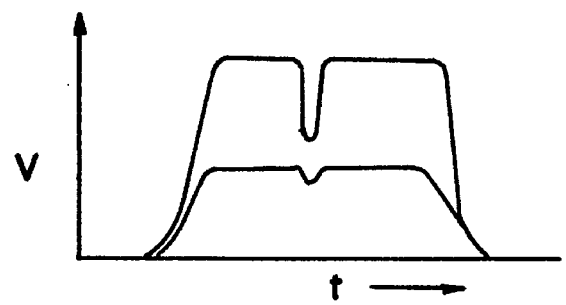
FIG. 9 is a schematic illustration of the difference in fractional sensitivity of a HOHPS mode wave as compared to a quasi-Rayleigh wave.

During an initialization process, the host computer 22 is responsive to the values stored in the static RAM 92 for an untouched panel 70 to set the gain on the R.F. amplifier 82 via a buffer 94, the output of which is coupled to a digital to analog converter 96. The automatic gain control provided by the feedback loop 98 adjusts the gain to make best use of the dynamic range of the analog-to-digital converter 88. The feedback loop 98 can either be programmed to maintain a fixed gain during the wave form, or vary in time in such a fashion to give an approximately flat signal for an untouched sensor. By allowing a reduced input dynamic range and increased gain in the analog-to-digital converter 88, the latter approach can partially compensate for the lower fractional sensitivity of a HOHPS wave as compared to a quasi-Rayleigh wave (in the active region of the substrate) as illustrated in FIG. 9.

Figure 6:
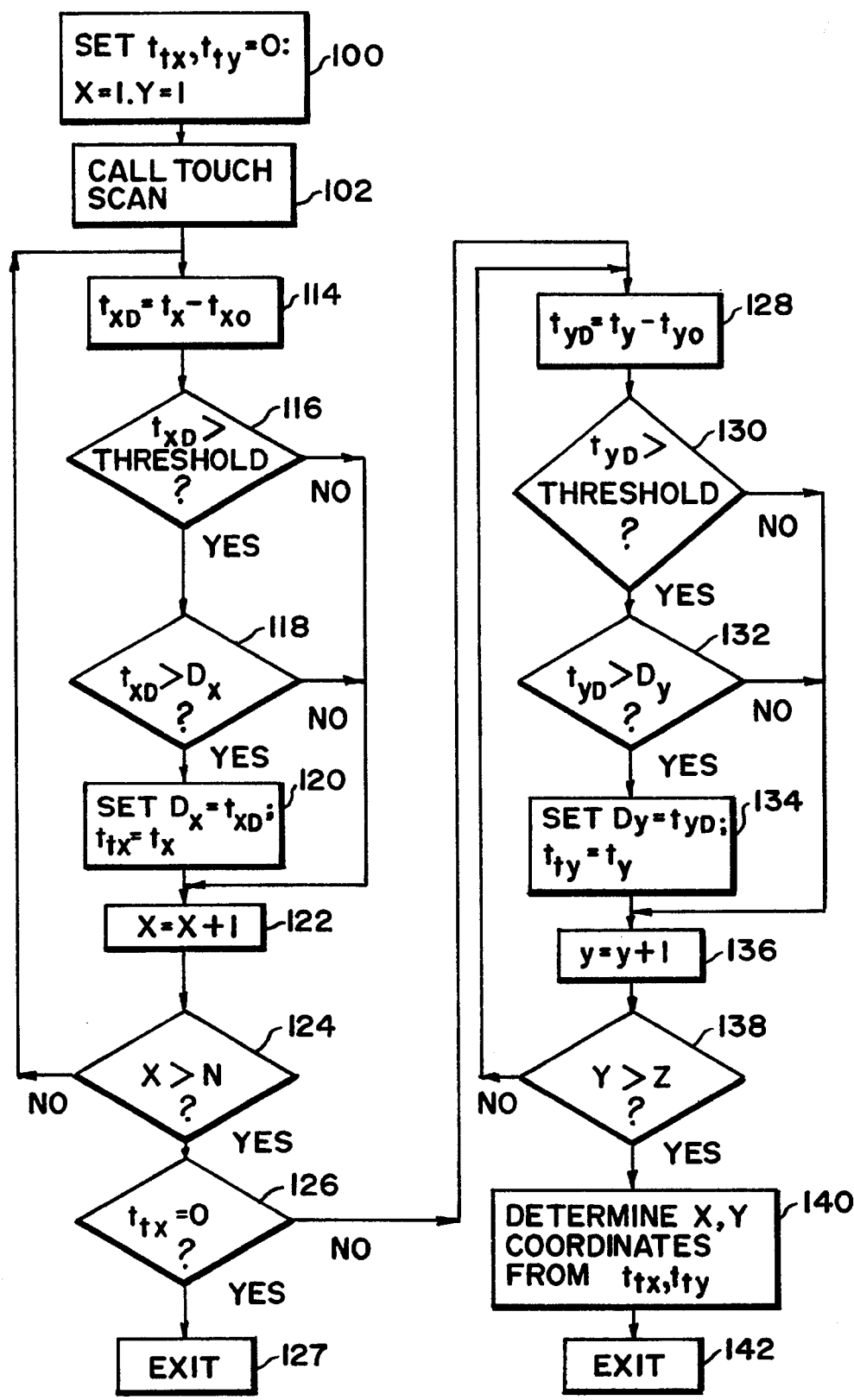
FIG. 6 is a flow chart illustrating one possible implementation of the position determining operation of the sensor of the present invention.
Figure 7:
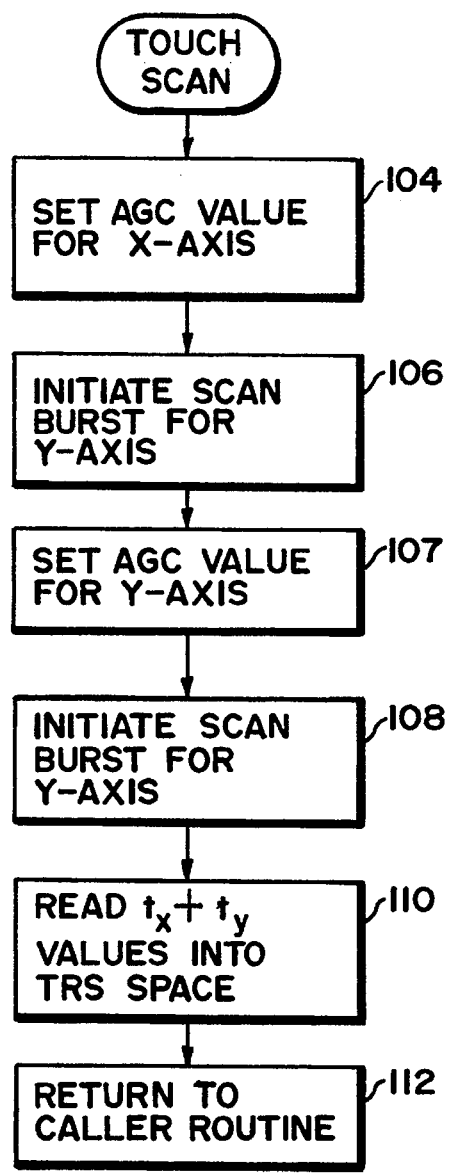
FIG. 7 is a flow chart illustrating the touch scan routine called by the software routine illustrated in FIG. 6.

The operation of the host computer 72 in determining the position of a touch on the touch panel 70 is illustrated in FIG. 6. During the initialization of the system, a scan cycle is performed for an untouched panel 70 with the X and Y amplitude values stored in the static RAM 92 as a baseline for the times $t_{x0}$ and $t_{y0}$. During the initialization process the X and Y amplitude values for each sampled point in time $t_{x0}$ and $t_{y0}$ is read out from the static RAM 92 and stored in a RAM 101 of the host computer 72. After the initialization is performed, at a block 100 the host computer 72 sets the values of $t_{tx}$ and $t_{ty}$ equal to zero and the variables X and Y equal to 1. Thereafter, at block 102, the computer 72 calls a touchscan routine as shown in FIG. 7. The touch scan routine is a "terminate and stay resident" routine, i.e., one that is periodically executed without being reloaded, that is stored in the RAM 101 of the host computer 72. The host computer 72 in accordance with the touch scan routine at a block 104 sets the automatic gain control value for the R.F. amplifier 82 for the X axis to the value determined upon initialization. Thereafter, at block 106 the host computer 72 initiates a scan burst for the X axis by instructing the controller 74. After the X axis values for times $t_x$ are stored in the static RAM 92, the computer 72 at a block 107 sets the automatic gain control value for the Y channel and at block 108 instructs the controller 74 to initiate a scan for the Y axis. After the Y axis values for times $t_y$ are stored in the static RAM 92, the computer 72 at block 110 reads each of the amplitude values stored for times $t_x$ and $t_y$ in the static RAM 92 into a portion of the RAM 101. Thereafter at block 112, the computer 72 returns to the routine depicted in FIG. 6. The static RAM 92 serves as a buffer to capture the data from the receiving transducer, and therefore allows the computer 72 to operate at a slower data rate than that necessary for the data acquisition subsystem.

After the X and Y axis amplitude values for times $t_x$ and $t_y$ are read from the static RAM 92 into the RAM 101 of the host computer, the host computer 72 at block 114 determines a difference value $t_{x0}$ from the difference between the amplitude value stored for $t_x$ wherein x was initialized to 1 at block 100 and the amplitude value stored for $t_{x0}$, i.e., for x=1, $t_{10}$ where $t_{10}$ represents the amplitude value stored for the first sampled time during the initialization routine. Thereafter, at block 116 the computer determines whether the difference value $t_{xD}$ is greater than a threshold value, and if it is, the computer 72 at block 118 determines whether the difference value $t_{xD}$ is greater than Dx which represents the greatest difference value detected for the X axis. If $t_{xD}$ is greater than Dx, the computer 72 at block 120 sets Dx equal to the difference value $t_{xD}$ and sets the time of occurrence $t_{tx}$ of the difference value equal to $t_x$. At block 122 the computer 72 increments x by one and if x is not greater than N, the number of sampled time points for the X axis, as determined by the computer 72 at block 124, the computer 72 returns to block 114 to determine the next difference value. After difference values are determined at block 114 for each point in time sampled by the analog to digital converter 88 and for which amplitude values are stored in the RAM 101, the computer 72 at block 126 determines whether $t_{tx}$, the time of occurrence of the greatest amplitude difference Dx, is equal to zero or not. If $t_{tx}$ is equal to zero indicating that no touch is detected on the X axis, the computer 72 exits the routine at a block 127. If however, the value of $t_{tx}$ is not equal to zero indicating a touch the time of occurrence of which is equal to $t_{tx}$, the computer 72 goes to block 128.

At block 128, the computer 72 compares the amplitude stored at time ty to the initialization value stored for that same point in time $t_{y0}$ and stores the difference there between as $t_{yD}$. At block 130, the computer 72 compares $t_{yD}$ to a threshold and if $t_{yD}$ is greater than the threshold the computer 72 at block 132 compares $t_{yD}$ to Dy, the value of the greatest difference calculated at block 128 for the Y axis signal. Thereafter, at block 134 if $t_{yD}$ was determined to be greater than Dy at block 132, the computer 72 at block 134 sets Dy equal to $t_{yD}$ and the time of occurrence $t_{ty}$ of the greatest difference signal Dy equal to $t_y$. At block 136 the computer 72 increments the variable y by one and at block 138 compares y to the number Z of sample points for the Y axis signal. If y is less than or equal to Z the computer 72 returns to block 128. If y is greater than Z indicating that a difference signal has been calculated for each sampled point on the Y axis, the computer 72 at block 140 determines the X and Y coordinates of a touch from the values of $t_{tx}$ and $t_{ty}$.

Thereafter at block 142 the computer 72 exits the routine. Other refinements to this basic scheme are known in the art and may be applicable to the present invention.

Figure 15:
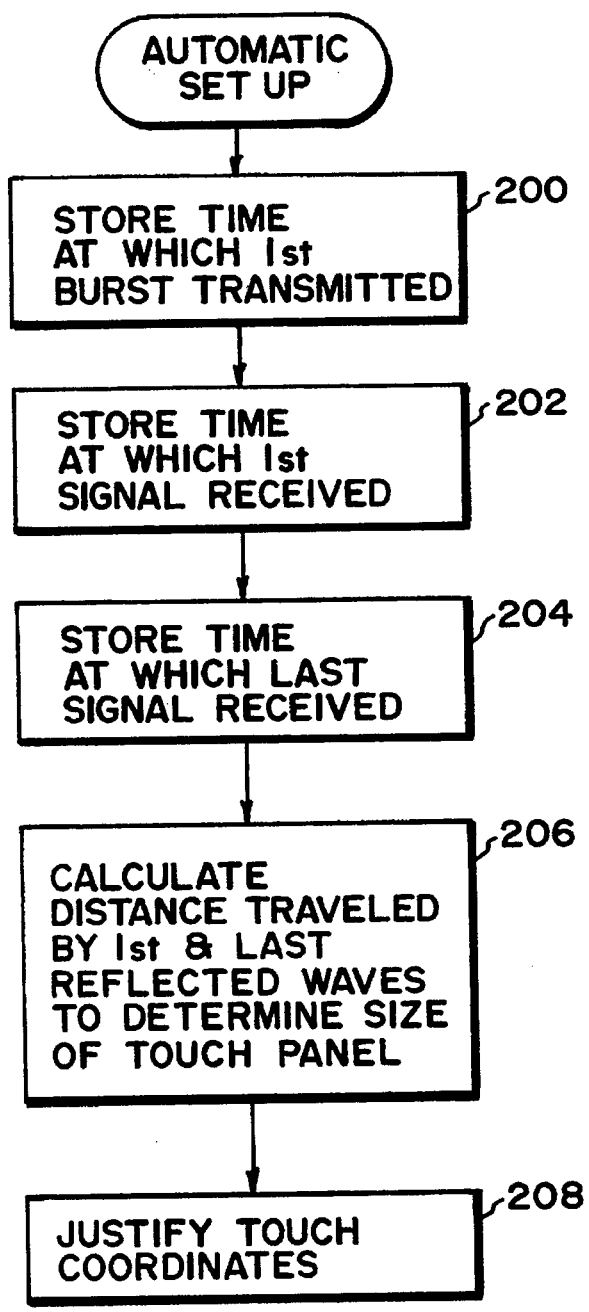
FIG. 15 is a flow chart illustrating an option for an automatic set up program implemented by the computer shown in FIG. 5.
Figure 17:
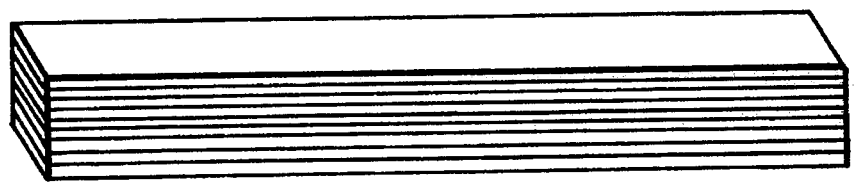
FIG. 17 is a perspective view of a laminated structure of the type that can aid in mode selective filtering.

The size of the touch panel may also be automatically determined in accordance with the flow chart depicted in FIG. 15 so that touch panels of various sizes may be utilized with predetermined software for controlling the microprocessor and the same electronics, and determine at the time of installation or usage the size of the panel. Upon entering the automatic set up program, the computer 72 at block 200 instructs the controller 74 to apply a drive signal to the transmitting transducer 18 to cause a burst to be transmitted to the array 28, the computer 72 storing the time at which the first burst signal is transmitted. Thereafter, at block 202 the computer 72 stores the time at which the first signal is received by the receiver 20. At block 204 the computer 72 stores the time at which the last signal, generated in response to the first transmitted burst is received by the receiver transducer 20. The computer 72 then utilizes the velocity of the wave through the substrate 10, which is known, to calculate at block 206 the distance traveled by the first and last reflected waves from the times stored at block 200 in conjunction with the times stored at respective blocks 202 and 204. More particularly the computer 72 determines the size of the touch panel along the Y axis from the times stored at block 200 and 202. The computer 72 further determines the size of the touch panel along the X axis from the time stored at block 206 as well as the times stored at block 202. At block 208, the computer 72 utilizes the calculated size of the touch panel to automatically adjust softwave parameters which depend on panel size.

The reflective arrays 28, 30, 34 and 36 are formed by screening glass frits through a stencil on the top surface 40 of the substrate 10. The reflective array frits may be formed during the same cycle as other frits which may be formed on the substrate. For example, in other embodiments of the invention, conductive frits are used to bond the transducers directly to the substrate 10, without a plastic wedge. The reflective arrays may also be formed of metal and bonded on to the top surface 40 of the substrate 10.

The circuitry may also be implemented in other ways according to known methods. ASIC implementing most of the functionality are preferred, one device incorporating the essential digital control circuitry, one device incorporating the analog transmit and receive circuitry, with a separate analog to digital converter, RAM and controller, which may be of standard design. Other device partitioning among packages is also possible, and a single chip embodiment may be useful, incorporating the digital circuitry as well as the low voltage analog circuitry.

In a preferred embodiment, a digital controller provides overall control and processing, as well as sensor output. This controller, which is a microprocessor, provides an interface to external systems, detects contaminants on the substrate, and controls the timing of relearn or reprocess events. An ASIC is provided which controls the normal operation of the sensor, performing burst and acquisition cycles, determining touch existence data relating to location and dimension, and controls various gains of gain controlled elements. An analog ASIC is also provided which amplifies and conditions the signals from the transducers.

The system may include a digital filter topology for determining a signal baseline of the received signal, which will automatically compensate for slow changes in environmental factors, while providing sensitive response to touch.

The detection system may also include synchronous detection, homodyne or superheterodyne-type receivers, full digital domain processing, switched capacitor filters and SAW filters.

When multiple element receiving transducers are employed, the signals may be combined electronically in an analog preamplifier, or the individual signals may be processed separately. The configuration of the receiving transducer may allow selective reception of a desired signal. In the case of separate processing, the signals may be down converted by an IF mixer, and subsequently processed in the digital domain to provide greater flexibility, such as a capability for differing operating frequencies and increased signal to noise ratio.

Transducer Interface

The transmitting transducer is a piezoelectric element, having conductive elements on two opposing surfaces, and which generates compression waves when excited by an oscillating voltage signal, e.g., about 50 V. The necessary excitation voltage will vary based on the sensor size, efficiency of the transducers, and other engineering parameters.

The receiving transducer is also a piezoelectric element, having conductive elements on two opposing surfaces, and in fact may be the transmitting transducer itself in certain embodiments. When the same transducer is used for both transmission and reception, the low voltage highly sensitive receiver electronics are temporarily disconnected through a high impedance switch from the transmitting electronics. This is described above. Even when two different transducers are employed, or when transducers are provided separately for the different axes, the receiving electronics may be disconnected during any wave excitation in the substrate, as electronic cross-talk may produce unacceptably high voltages for the receiving system. The normal received signal amplitude is between about 100 µV to about 1 mV RMS, although this may vary according to system design.

The transmitting transducer receives a sine wave or pseudo sine wave excitation signal at the desired frequency, controlled directly by the controller. The preferred excitation frequency is about 5.53 MHz, which is within the direct control capability of the microcomputer control system. Generally, for a given system, the excitation amplitude remains constant, although according to the present invention, the amplitude may be varied for varying conditions of sensor use. Amplitude may also be varied within a single pulse train. Normally, the sensor is tuned for use at a specific frequency or set of frequencies, and therefore this parameter is predetermined, however, the system may also have an operating frequency which compensates for environmental changes, such as temperature.

According to the present invention, a chirp or pseudo-chirp may also be employed. A chirp may be employed where the acoustic beam is to be focussed at a particular location, and therefore the reflective array is designed to deflect waves only having a specific frequency to the location, e.g., the reflective array has a reflection characteristic (other than amplitude) which varies over distance, such as reflective element angle and/or spacing. Thus, the chirp would sweep the range of locations, and a fixed frequency would select a particular location.

Figure 18:
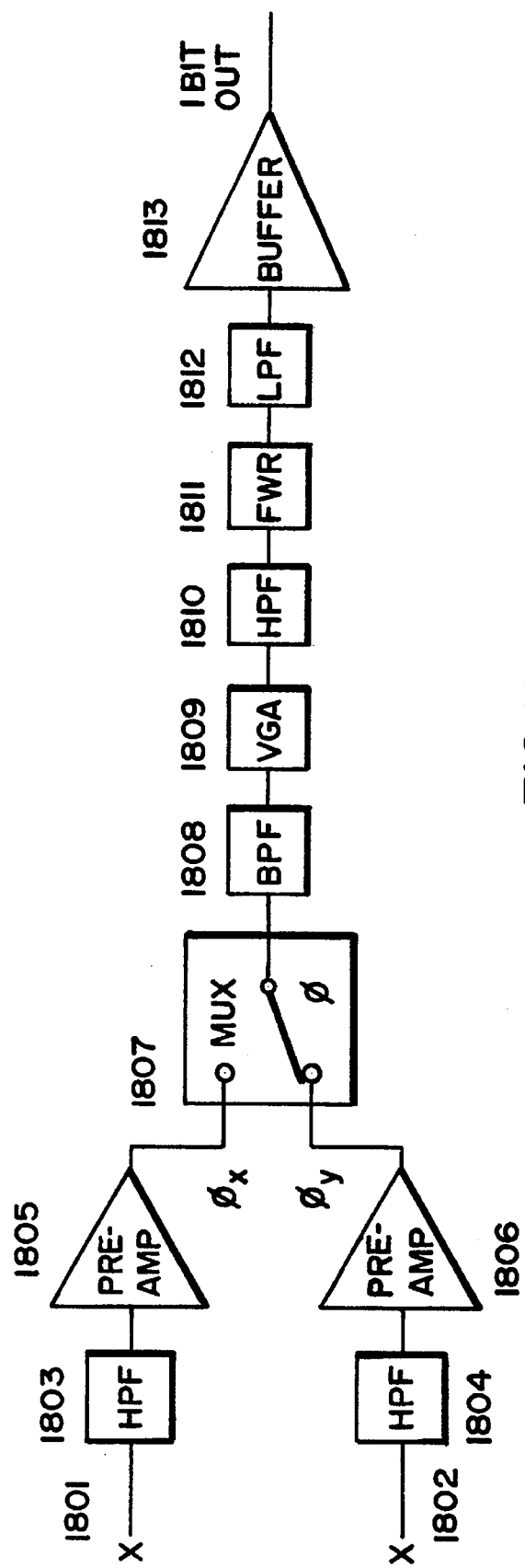
FIG. 18 is a block diagram of a transducer interface circuit.

A block diagram of the analog circuit interface for the transducers is shown in FIG. 18 as a block diagram. The receiving transducer is connected to the receiving electronics when the transmitter is inactive. The receiving transducer develops a voltage signal of about 100 µV to 1 µmV RMS in response to the returning acoustic signal. Inputs from an X and Y axis receiving transducer, 1801 and 1802, respectively, are decoupled to prevent overload during transmitting transducer excitation, not shown. The signal are capacitively coupled, e.g., through a high pass filter 1803, 1804, and amplified by preamplifiers 1805, 1806. The outputs of multiple preamplifiers 1805, 1806 are time multiplexed with a multiplexer 1807. The output of the multiplexer 1807 is amplified, preferably with a controlled or variable gain amplifier 1809, for example a voltage controlled amplifier. A suitable controlled gain amplifier is the MC1350, which is an RF automatic gain control amplifier. A band pass filter 1808 is placed between the multiplexer 1807 and the controlled gain amplifier 1809. The output from the controlled gain amplifier 1809 is AC coupled capacitively or inductively in a high pass filter 1810 to an AM detector, which may be, e.g., a full wave rectification circuit 1811. A suitable detector is an MC 1330 detector. The output of the detector, which will be a rectified DC signal which has an amplitude which is modulated by the position information, is filtered to eliminate the carrier frequency and the retain the information by a low pass filter 1812. The filter is then buffered by a buffer 1813 amplifier and correctly biased. The output 1814 of the buffer, is then sampled by an analog to digital converter (ADC), having 8–12 bit resolution, at a rate in excess of the Nyquist rate, e.g., about 1 megasample per second. Since this data rate may exceed the capacity of the microcontroller, the output of the ADC is buffered in a memory, which may be configured as a FIFO buffer, ring buffer or random access memory (RAM).

Back-to-back diodes may be used to protect the input to the receiving signal conditioning circuitry, and a channel select circuit may be implemented with another diode in known manner. The drivers for the transmitting piezoelectric transducers may be, for example, SI9942 N and P channel MOS drivers, driven from logic level by a TC1427 driver.

After the signal is acquired, it is transferred to the digital processor for analysis. This analysis may be a simple deviation from baseline analysis which detects super-threshold variations in signal amplitude, representative of touch. The analysis may also include digital filtering, using FIR (moving average), IIR, auto regression, or more complex filters such as auto regression and moving average process filtering. In the processing, the characteristic time delay for a perturbation is translated to a position of a touch. This conversion may also include a compensation for nonlinearities or variations in the system, which may be preprogrammed, adaptive or responsive to environmental sensors. For example, curvature of a spherical substrate will cause a nonlinear relationship between delay time and position. In a calibration process, this may be discovered and later compensated. Likewise, changes in environmental conditions may alter the time-position relationships. When a finger is used as the touch member, it is desired to locate where the user intended to touch despite such confounding effects as parallax between the touch surface and the display image surface. The controller may be preprogrammed or learn to compensate for these factors, using traditional logic or model based methods, an expert system, fuzzy logic, neural networks or other known means.

When the received waveform is complex, including multipath response from the sensor panel or other interfering signals, it may be preferred to process the received signal at very high resolution, in order to resolve these effects. For example, the received signal may be digitized directly after preamplification and standard signal conditioning, and processed using a digital signal processor (DSP). In this case, the DSP may operate in real time, although it is preferred to buffer the received digitized waveform in a RAM and process it with some latency. In this case, for a 5.53 MHz excitation, and a 0.500 mS echo analysis, a RAM buffer on the order of about 8 kBytes is required, with samples acquired about every 83 nS. Of course, this storage requirement may be reduced if the entire signal need not be fully analyzed; for example, the signal may be divided timewise, and blocks of consecutive samples analyzed consecutively. This will focus the analysis on sections of the sensor for each excitation burst.

Forming Reflective Arrays

The reflective arrays are preferably formed by screening glass frits through a stencil on the top surface 40 of the substrate 10. The reflective arrays 28, 30, 34 and 36 may also be formed of metal and bonded on to the top surface 40 of the substrate 10. As discussed above, each reflective element of the arrays 28, 30, 34 and 36 is disposed at an angle selected to direct a particular order HOHPS, with respect to its associated transducer 18, 20, 22 and 24, toward a corresponding reflective element of the opposing reflective array or to a reflective edge, so that a VLCW travels along the axis of the reflective array, while the energy of the VLCW is directed as a HOHPS across the substrate to the opposite side, and is subsequently converted back to a VLCW and detected by the receiver. Preferably, the spacing between adjacent reflective elements along the array axis is equal to an integral multiple of one wavelength of the VLCW imparted into the substrate 10 by the respective transducer. The reflective elements are preferably about one half wavelength wide in the direction parallel to the transducer beam. Further, the width of each reflective array 18, 20, 22 and 24 is about equal to the width of the transducer where the drive signal applied to the transducer is a sine wave. The array may also vary in width corresponding to the broadening of the transmitted VLCW as it travels across through the array.

Mode Selective Filters

Figure 4:
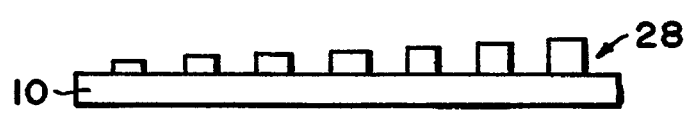
FIG. 4 is an illustration of the variable height reflective elements that provide one option for forming a reflective array as shown in FIG. 3.

Constant power density of the shear wave in the substrate is obtained by increasing the power reflectivity at points along the array as the distance of the points along the array from the respective transducer increases, by providing a variable spaced reflective array or a variable height reflective array is provided as shown in FIG. 4, and in accordance with Equations 2, 3 and 4, supra. The waveforms shown in FIG. 8 are obtainable by employing such methods wherein the amplitude of the HOHPS waves as reflected by the array elements is maintained substantially constant across the array in the absence of a touch.

Figure 13:
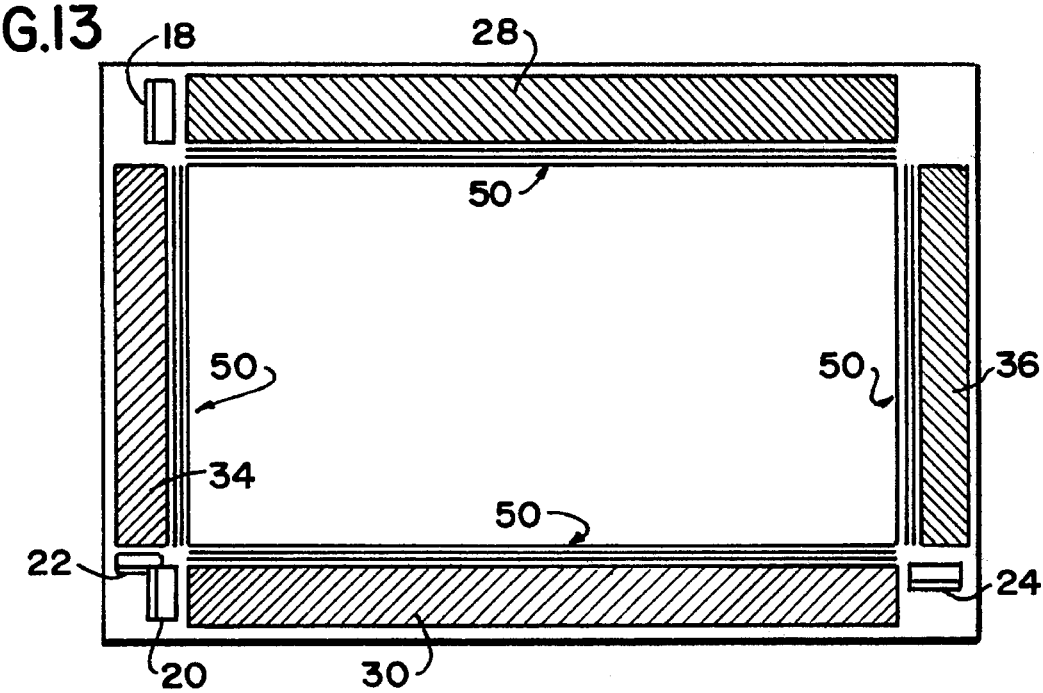
FIG. 13 is a top view of the touch position sensor shown in FIG. 3 with spurious mode suppressor reflectors disposed thereon.
Figure 14:
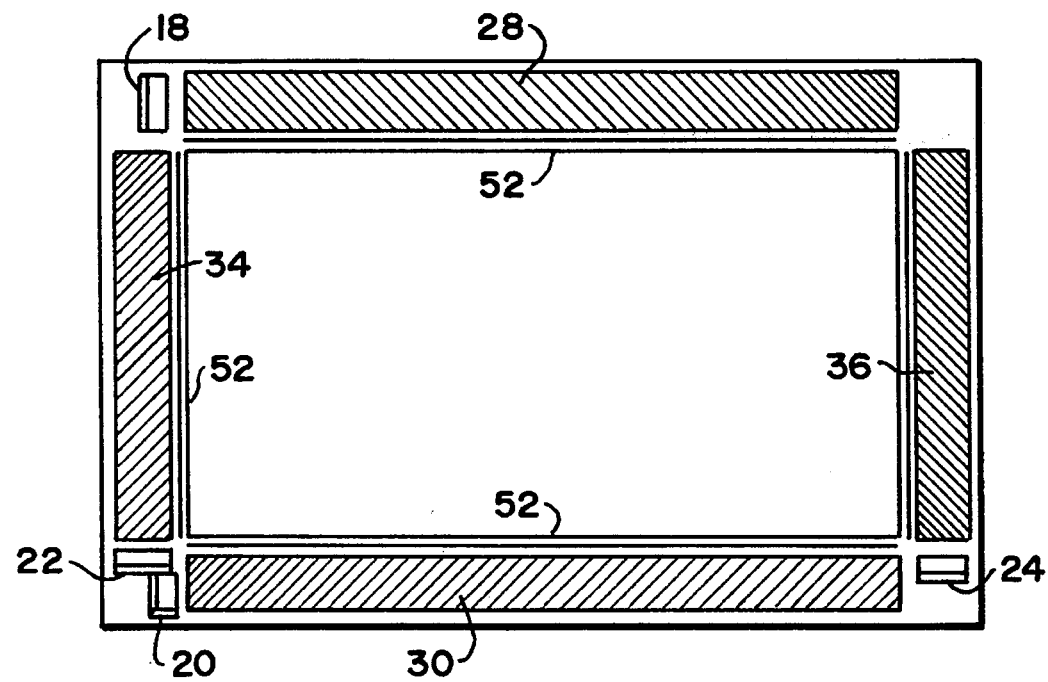
FIG. 14 is a top view of the touch position sensors shown in FIG. 3 with absorbing strips mounted thereon.

FIGS. 13 and 14 illustrate methods of further reducing interference from undesired waves, which may be caused by shear waves of orders different than the wave desired. More particularly, in FIG. 13 spurious mode suppressor reflectors 50 are positioned adjacent to each of the reflective arrays 28, 30, 34 and 36, the reflectors 50 extending parallel to the axis of the associated array. The spacing between the reflector strips is selected to be equal to one quarter of a wavelength of the wave to be passed. In an alternative embodiment shown in FIG. 14, a strip of an absorbing material 52 is disposed adjacent to and in front of each of the reflective arrays 28, 30, 34 and 36 on the top surface 40 and optionally on the bottom surface 42 of the substrate 10 in order to absorb spurious Lamb wave energy. Lamb waves are preferentially absorbed with respect to HOHPS. Effective absorbing strips can be formed from epoxies, silicones, and the like, or from tape. The width of the absorbing strips on the top surface 40 are preferably no more than 25% of the array width, about 3 mm. An advantage of the present invention is that such absorptive filters can be placed on the bottom surface 42 under the arrays. For particular applications the touch panel is required to be affixed to an overlying rim or bezel with a sealant, such as a silicone RTV or the like, in which case the sealant itself may act as the upper absorbing strips.

In applications where a rim or bezel is required to extend about the periphery of the touch panel the rim or bezel may be limited in width so that it cannot mask both the reflective arrays and absorbing strips from the viewing area of the display. An embodiment that alleviates this problem is shown in FIG. 16. Here the reflective elements in the arrays 28' and 30' are mirror reflected with respect to the axis of arrays 28 and 30 shown in FIG. 3. These absorbing strips suppress undesired waves having a vertical component, i.e., Rayleigh and Lamb waves. The desired mode HOHPS wave is now reflected outward onto the adjacent edge 220 of the substrate, which serves as a highly efficient reflecting element to redirect the wave energy across the substrate to the opposing edge 222. Upon edge reflection, the wave passes through the array 28', a fraction of the wave power being diverted to the left as a VLCW. The opposing edge 222 reflects the waves to the receiving array 30' which in turn directs the waves into the receiving transducer 20, a comparable fraction of energy being diverted to the right by the receiving array when the wave passes through. The purpose of this embodiment is that it allows a selective filter 52 to be placed at the back of the arrays 28' and 30' close to the edges 220 and 222 of the substrate 10, thereby freeing up space at the front of the array. The reflecting path traverses each absorbing strip twice, towards and away from the strip, hence the strips are approximately twice as effective and can be reduced in width as a consequence.

In practice, the function of the absorbing strips may be incorporated into the tape which confines the transmitting and receiving cables to the edge of the substrate. It is noted that only two arrays 28' and 30' are shown in FIG. 16 for simplicity, and a corresponding set of arrays for another axis of detection may be provided. The reflective elements in the arrays shown in other figures depicting additional embodiments of the present invention may also be rotated by 90° as will be apparent to one skilled in the art.

It is also noted that the desired HOHPS wave need not propagate at right angles to the reflective array, and may propagate at some other angle, so long as the opposing array is situated to convert the desired mode HOHPS wave to a VLCW and direct it to a receiving transducer. Further, an edge of the substrate may be formed such that it has facets which direct the HOHPS wave in the desired direction, or has a corresponding array pattern which assists and/or cooperates with the reflective array in selecting the desired mode HOHPS wave. These facets will normally each have a face which placed at the desired angle for reflection of the wave, each such face being offset by an integral number of half wavelengths, so as to maintain the phase coherency of the wave. Thus, the substrate as a whole acts as a filter for the desired mode wave, and standard tuning and optimizing techniques may be employed.

A plastic sheet having an optical coating, e.g., a film with an HEA coating manufactured by OCLI, to eliminate or minimize optical reflection may be laminated to the bottom surface of the substrate 10. Such a plastic coating on the back side of the substrate, may be used for safety reasons to limit damage due to breakage of a glass substrate. The glass may also be tempered, limiting the need for other strengthening or fracture limiting measures. Thus, preferred 0.090" glass substrate according to the present invention may be tempered, coated or otherwise processed as is conventional. This plastic sheet preferably serves the purpose of a mode selective filter, and therefore is carefully controlled in thickness and acoustical properties.

Such plastic coatings may be particularly appropriate for a Rayleigh-Love-Rayleigh sensors in which none of the desired modes have significant motion on the back surface.

Second Embodiment of Sensor System

Figure 10:
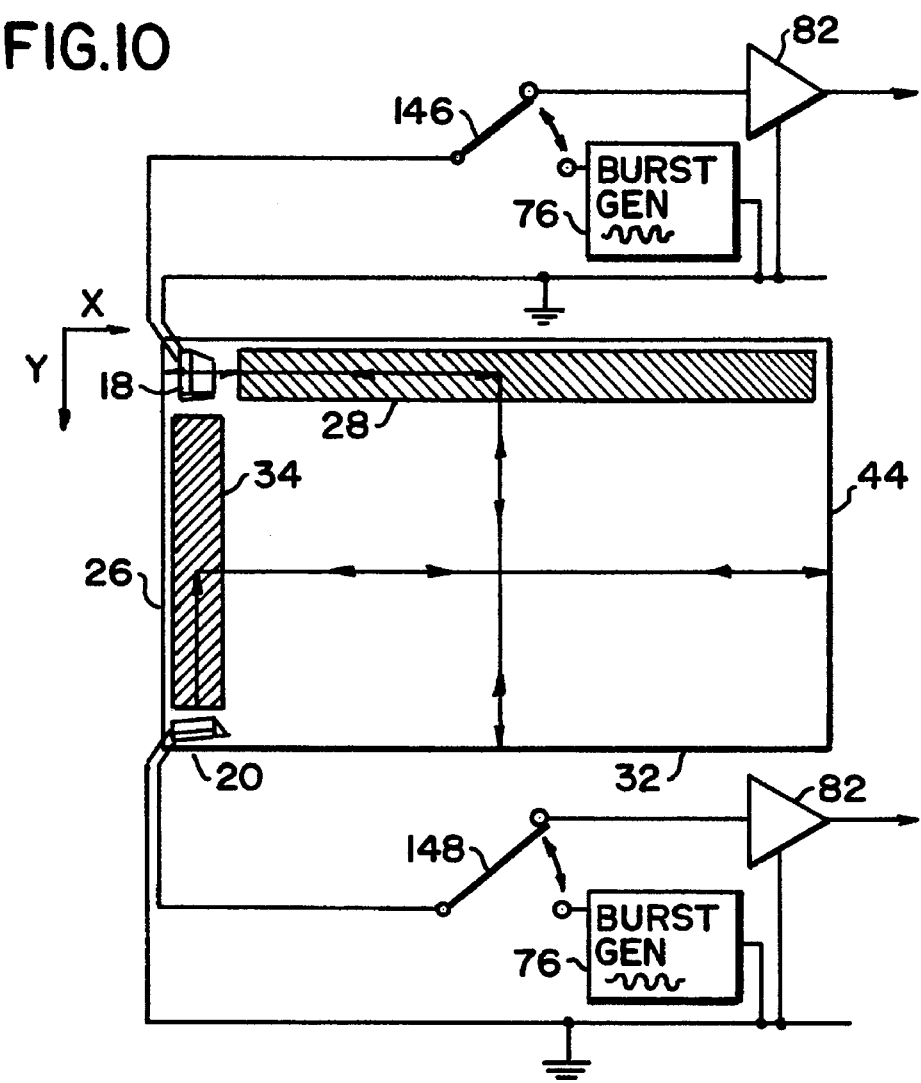
FIG. 10 is a top view of a second embodiment of the touch position sensor in accordance with the present invention.

A second embodiment of the touch position sensor of the present invention is shown in FIG. 10 and includes a single transducer for transmitting and receiving the VLCW associated with each axis, the coordinates of a touch on which is to be determined. Further, instead of having two reflective arrays for each axis as the embodiment depicted in FIG. 3, the touch position sensor shown in FIG. 10 includes a single reflective array 28, 34 for each axis wherein the side 32, 44 of the substrate 10 opposite to each array 28, 34 is machined to provide a reflective edge. Because shear-type waves reflect with high efficiency, the reflective edge 32 and 44 of the substrate 10 reflects the HOHPS waves propagating perpendicular thereto without substantial loss in energy. As is apparent to one skilled in the art, transducers 18 and 20 may be placed in a common corner.

More particularly, the transducers 18, 20 are coupled to transmit/receive switches 146, 148 that are controlled by the controller 74 to couple the X or Y driver 76, or burst generator to the transducers 18, 20 during a first time period to apply the drive signal thereto. The transducers 18, 20 are responsive to the drive signal to impart a VLCW onto the substrate 10 that propagates along the axis of the arrays 28, 34, respectively. The reflective elements of the arrays 28, 34 reflect portions of the VLCW incident thereto as a selected mode HOHPS wave angled normal to the incident VLCW, across the substrate 10 in the Y or X direction, respectively to the reflective edges 32, 44 of the substrate 10. The substrate edges 32, 44 reflect the HOHPS waves propagating perpendicular thereto back to the reflective arrays 28, 34 which in turn reflect the waves as VLCW back to the transducers 18, 20. After the drive signal is applied to the transducers 18, 20, the controller changes the state of the transmit/receive switches 146, 148 to the receive position wherein the transducers 18, 20 are coupled to the R.F. amplifier 82 so that VLCW sensed by the transducers are coupled to the position detection circuitry.

Third Embodiment of Sensor System

Figure 11:
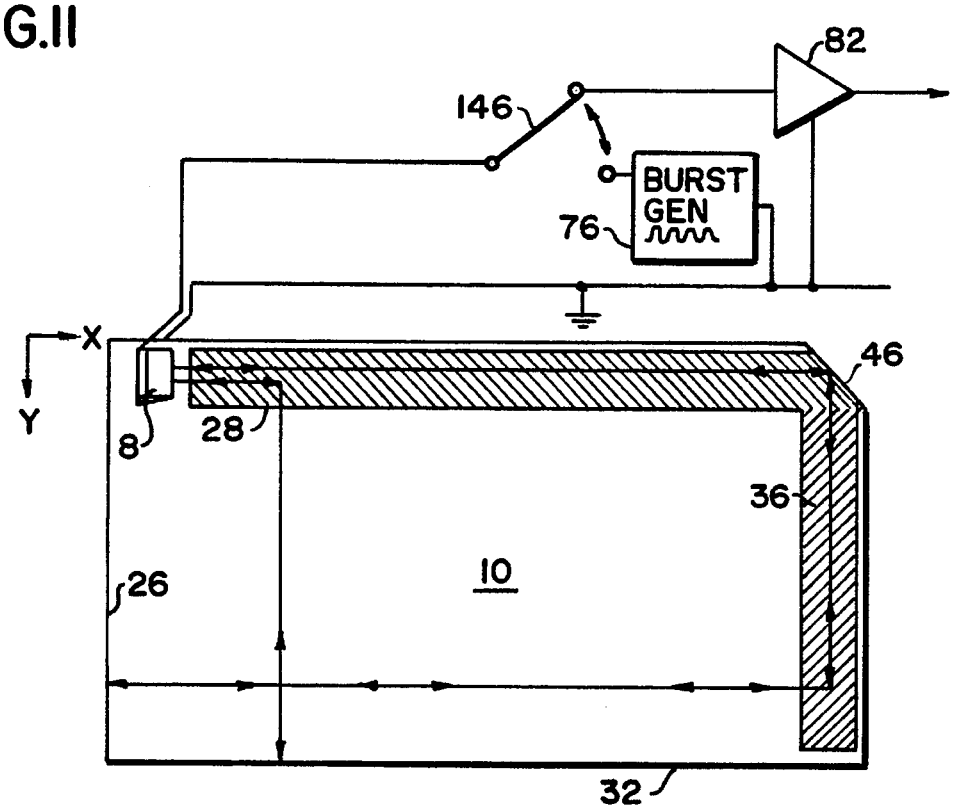
FIG. 11 is a third embodiment of the HOHPS mode wave touch position sensor in accordance with the present invention.

A third embodiment of the touch position sensor of the present invention is shown in FIG. 11 and includes a single transducer for transmitting and receiving the VLCW associated with two perpendicular axes the coordinates of a touch on which are to be determined. In this embodiment, two reflective arrays are employed, a first reflective array 28 extending along an axis perpendicular to the side 26 on which the transducer 18 is mounted and a second reflective array 36 extending along an axis perpendicular to the axis of the first array 28 and adjacent to the end of the array 28. In order to couple a VLCW propagating along the axis of the reflective array 28 to the perpendicular reflective array 36, the corner of the substrate 10 intersecting the axes of the arrays 28 and 36 is cut in order to provide a reflective edge 46 that is disposed at a 45° angle with respect to the adjacent sides 44 and 48 of the substrate 10. Of course, it is understood that this corner may have other configurations, according to the present invention, to filter the signal, have an angle selected to convert the wave to a HOHPS directed to the reflective array 36, which will then be reflected and traverse the substrate as a VCLW, allowing dual mode operation along the different axes, or provide other functions.

In response to a drive signal from the driver 76, the transducer 18 imparts a VLCW onto the substrate 10 that propagates along the axis of the array 28. The reflective elements of the array 28 reflect portions of the VLCW as a selected mode HOHPS wave along a plurality of paths parallel to the Y axis to the side 32 of the substrate 10 wherein the side 32 is machined to provide a reflective edge. The side 32 of the substrate 10 reflects the HOHPS waves propagating perpendicular thereto back to the array 28 which in turn reflects VLCW, derived from the HOHPS waves reflected by the reflective array from the side 32 back to the transducer 18. When the VLCW propagating along the axis of the reflective array 28 meets the reflective edge 46, the edge 46 reflects the VLCW along the axis of the second array 36.

The elements of the second array 36 reflect portions of the VLCW along parallel paths as a selected mode HOHPS wave across the substrate in the -X direction to the opposite side 26 of the substrate 10, which is machined to provide a second reflective edge. The substrate side 26 reflects the HOHPS waves propagating perpendicular thereto back to the second reflective array 36 which in turn reflects the HOHPS waves as VLCW, to the reflective edge 46. The reflective edge 46 then reflects the VLCW back to the transducer 18. The transducer 18 senses the VLCW reflected back and provides a signal representative thereof.

Figure 12:
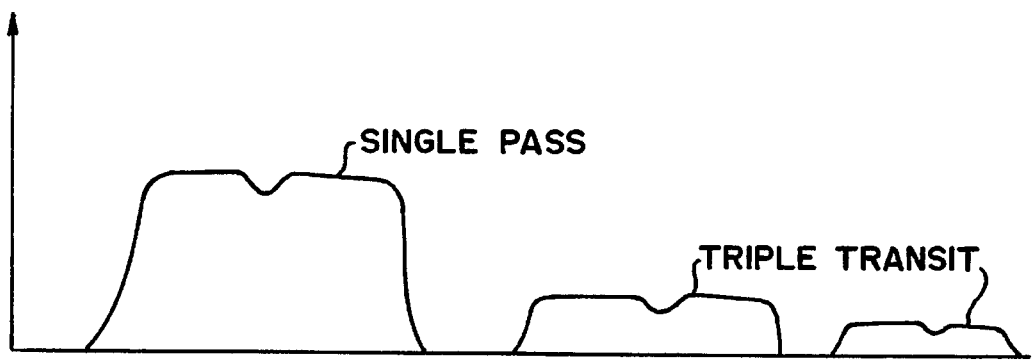
FIG. 12 is a schematic illustration of the waveform generated by the sensor shown in FIG. 11 to be compared with the waveform generated by the sensor shown in FIG. 3.

This mode of operation is designated the triple transit mode. In the triple transit mode, the amplitude of the signal provided by the transducer 18 is reduced as compared to the amplitude of a signal generated by the transducer 20 as shown in FIG. 3, this difference in amplitude being depicted schematically in FIG. 12. The increase in fractional sensitivity of the triple transit mode sensor is approximately 3 dB greater than a single transit. This is because the wave passes through the absorbing structure twice, and thus a proportionately greater portion of the wave energy is absorbed. It is noted that in the preferred embodiment the transducer 18 is positioned on the side of the substrate 10 that is perpendicular to the axis of the longest reflective array so that there are no overlapping path lengths associated with the X array and the Y array.

Fourth Embodiment of a Sensor System

A fourth embodiment of the touch position sensor of the present invention is shown in FIG. 19 and includes a single transducer for transmitting and receiving the VLCW associated with each axis, the coordinates of a touch on which is to be determined. The touch position sensor includes a single reflective array 28, 34 for each axis wherein the side 32, 44 of the substrate 10 opposite to each array 28, 34 is machined to provide a reflective edge. The circuitry is similar in execution to that described in the Second Embodiment of a Sensory System, supra.

It is noted that a Love wave, like a HOHPS wave, has a non-uniformly distributed (along the vertical axis) horizontal shear-type wave motion. Therefore, the Love wave satisfies the conditions of being an acoustic wave having a horizontal shear-type component substantially parallel to a surface of the propagating medium, having a nonuniform volumetric energy density along a vertical axis normal to the surface and having energy at the surface. The principles of the present invention may be used to reflect a quasi-Rayleigh wave energy into a particular Love wave mode for sensing. Further, the substrate need not be uniform over the entire area, so that the active sensing region of the substrate may support Love wave propagation, while the region around the transducer may support another mode of wave propagation. Of course, in such a case, care should be taken to avoid undesired discontinuities, which would reduce the coupling efficiency of the wave from one region of the substrate to the other.

The Love wave is a particular case of a wave having a non-uniform volumetric energy density along an axis perpendicular to the surface. More generally, there are three broad cases of such waves. Excluded are zero order horizontally polarized shear waves (ZOHPS), which propagate in uniform substrates of finite thickness. Zero order Love waves have a non-uniform energy density, although there is no nodal plane of wave energy parallel to the substrate surface. These waves may propagate in non-uniform substrates, having a variation, through the thickness of the substrate, in wave propagation phase velocities, resulting in an asymmetric wave energy distribution on the opposed surfaces. Higher-order horizontally polarized shear waves have nodal planes of wave energy, and therefore have a varying, e.g., non-uniform, volumetric energy density along an axis perpendicular to the surface. Such waves propagate in uniform substrates of finite thickness. Higher order Love waves also have nodal planes of wave energy, as well as an overall amplitude variation in the wave amplitude (amount of particle motion) through the thickness of the substrate. These waves propagate in non-uniform substrates having a variation, through the thickness of the substrate, in wave propagation phase velocities, resulting in an asymmetric wave energy distribution on the opposed surfaces. More generally, higher order horizontally polarized shear-type waves may propagate in various types of substrates, including uniform substrates, single or multiple laminates and gradient distributed phase velocity distributed materials, or combinations thereof. Such higher order horizontally polarized shear-type waves include higher order horizontally polarized shear waves, the zero order Love wave, higher order Love waves, and other such waves.

A substrate propagating Love waves can be a composite laminate of a 3 mm or less thick sheet of borosilicate glass 230 and a 2 mm or more thick sheet of soda-lime glass 231. These are laminated with, e.g., a photocuring transparent resin adhesive 232 or the like. Borosilicate glass 230 has a shear wave velocity of 3280 m/sec, while soda-lime glass 231 has a shear wave velocity of 3350 m/sec, a ratio of 0.98, at an excitation frequency of 5.53 MHz. This substrate supports Love wave propagation. See, Auld, B. A., *Acoustic Waves. Fields and Waves in Solids*, Vol. II. pages 95–99.

An example of such a substrate was fabricated at room temperature using 0.090" thick soda-lime glass and 0.100" thick borosilicate glass, bonded with Dymax 628-T UV curable adhesive, a preferred adhesive for bonding transducer wedges onto glass substrates. The resulting laminated substrate was about 7.6" by 10.8". The laminated substrate was tested by heating from room temperature to 100° C. at a rate of 10° C. per 20 minutes. No debonding, cracking or other change was observed, except a bowing of the substrate, due to the differences in the thermal expansion coefficients of the laminated layers. At 100° C., the borosilicate layer (lower coefficient of thermal expansion) was on the concave side, with a sagitta in the 10.8" dimension of 0.045", close to the theoretically expected 0.062".

A Love wave in such a borosilicate/soda-lime laminate has an asymmetric waveform which satisfies the equation:

$$\tan(k(ts)b) = Vs'Zs', \text{ and } n \cdot \pi < k(ts) \ b < n \cdot \pi + \pi/2 \qquad \text{Eq. 6}$$

wherein n is the order of the Love wave and b is the thickness of the borosilicate layer. These waves have energy which decays exponentially with increasing depth into the soda-lime layer, i.e., the higher velocity layer, so that one side, having the slower propagation velocity, has most of the volumetric energy density, while the other side has substantially lower volumetric wave energy and is insensitive to touch.

A laminated substrate having a 0.100" thick borosilicate glass layer and a 0.090" thick soda-lime layer has a predicated ratio front to rear surface shear motion amplitude difference of about 40 dB.

The substrate for propagation of a higher order horizontally polarized shear-type wave need not be a simple two layer laminate, and in fact may be mutli-layer, gradient or specially processed structure. Where there is asymmetry through a median plane of the substrate in phase propagation velocity, the wave power densities at the top and bottom surfaces will tend to be unequal. As stated above, laminates may be used to select a Love-type wave, or to act as a filter for propagating a selected wave mode, e.g., a higher order shear-type wave, or may serve both goals simultaneously. Filtering properties of a multi-layer substrate can be enhanced by placing lossy materials, e.g., an adhesive, at low amplitude portions of the desired mode which correspond to higher amplitude portions of at least one undesired mode. Other non-uniform substrates may be used to direct wave energy to a portion of the thickness of the substrate and/or to filter the wave to select a desired wave mode or to remove an undesired wave mode. A non-uniform substrate may be prepared by lamination, e.g., bonding two layers together; fusing layers having differing properties, e.g., borosilicate glass and soda-lime glass; thermally processing the substrate in a non-uniform manner, e.g., tempering the glass and selectively annealing one surface; ion implantation; ion diffusion; chemical treatment of one surface; and other known treatments or methods of obtaining a substrate having a thickness variation in propagation phase velocity.

The transducers, which are piezoelectric elements mounted on plastic wedges, can be mounted on the borosilicate glass side of such a substrate with Dymax 628-T UV curable adhesive. Other array and transducer arrangements can be implemented for a Rayleigh-Love-Rayleigh sensor including the layout according to FIG. 3.

It should be understood that the preferred embodiments and examples described herein are for illustrative purposes only and are not to be construed as limiting the scope of the present invention, which is properly delineated only in the appended claims.

What is claimed is:

1. A touch sensor comprising:
    a substrate having at least one touch surface and being capable of propagating an acoustic wave having a horizontal shear-type component substantially parallel to said surface, having a nonuniform volumetric energy density along a vertical axis normal to said surface and having energy at said surface;

a transducer for producing an acoustic wave having a longitudinal component along a first axis in said substrate, said first axis being parallel to said surface; and a first reflecting array having a length and being disposed along said first axis, for reflecting, along said length of said array, as a first reflected wave, portions of said wave having a longitudinal component, said first reflected wave having a horizontal shear-type component substantially parallel to said surface, having a nonuniform volumetric energy density along a vertical axis normal to said surface, and having energy at said surface, said first reflected wave being directed along a second axis in said substrate, different than said first axis, and having a component parallel to said surface;

whereby a proximity of an object to said substrate causes a perturbation in the power carried by said first reflected wave.

2. The touch sensor according to claim 1, further comprising a second reflecting array spaced from said first reflecting array across said substrate along said second axis of said first reflected wave, for reflecting said first reflected wave as a wave having a longitudinal component along a third axis.

3. The touch sensor according to claim 1, further comprising a reflecting member spaced from said first reflecting array across said substrate along said first axis, for reflecting said first reflected wave as a second reflected wave toward said first reflecting array along a fourth axis.

4. The touch sensor according to claim 3, wherein said fourth axis is antiparallel with said second axis, and said first reflecting array reflects said second reflected wave from said fourth axis to a fifth axis, antiparallel with said first axis as a wave having a longitudinal component.

5. The touch sensor according to claim 1, further comprising a transducer for detecting a perturbation in said first reflected wave.

6. The touch sensor according to claim 1, wherein a temporal characteristic of said perturbation corresponds to a position of said object in proximity to said substrate.

7. The touch sensor according to claim 1, further comprising:

a second transducer for producing an acoustic wave having a longitudinal component along a sixth axis in said substrate, said sixth axis being parallel to said surface; and a second reflecting array having a length and being disposed along said sixth axis, for reflecting, along said length of said array, as a third reflected wave, portions of said wave having a longitudinal component, said third reflected wave having a horizontal shear-type component substantially parallel to said surface, having a nonuniform volumetric energy density along a vertical axis normal to said surface, and having energy at said surface, said third reflected wave being directed along a seventh axis in said substrate, different than said sixth axis, and being parallel to said surface;

a proximity of an object to said substrate cause a perturbation in the power carried by said third reflected wave, so that said proximity causes a perturbation of waves travelling along both said second axis and said seventh axis.

8. The touch sensor according to claim 7, further comprising means for detecting a perturbation of said waves travelling along said second axis and said seventh axis.

9. The touch sensor according to claim 1, wherein said wave having a longitudinal component is a Rayleigh-type wave.

10. The touch sensor according to claim 1, wherein said wave having a longitudinal component is a Lamb-type wave.

11. The touch sensor according to claim 1, wherein said first reflective array comprises a diffraction grating of acoustic scattering elements, separating modes of said horizontal shear-type component substantially parallel to said surface, having a nonuniform volumetric energy density along a vertical axis normal to said surface and having energy at said surface, by differences in phase velocity.

12. The touch sensor according to claim 1, wherein said first reflected wave is a horizontally polarized shear wave of order greater than zero.

13. The touch sensor according to claim 1, wherein said first reflected wave is a horizontally polarized shear wave of order 4.

14. The touch sensor according to claim 1, wherein said first reflected wave is a Love wave.

15. The touch sensor according to claim 1, wherein said substrate has a thickness greater than about three times the Rayleigh wavelength of said first reflected wave.

16. The touch sensor according to claim 1, wherein said substrate has a thickness of about four times the Rayleigh wavelength of said first reflected wave.

17. The touch sensor according to claim 1, wherein said substrate is glass having a thickness of about between about 0.085" and 0.125".

18. The touch sensor according to claim 1, wherein said substrate is formed of plastic.

19. The touch sensor according to claim 1, wherein said substrate is formed of glass.

20. The touch sensor according to claim 19, wherein said substrate is formed of soda-lime glass.

21. The touch sensor according to claim 19, wherein said substrate is formed of borosilicate glass.

22. The touch sensor according to claim 19, wherein said substrate is formed of frosted glass.

23. The touch sensor according to claim 1, wherein said substrate is formed of a longitudinal laminate of a lower shear-wave-velocity material on top of a higher-shear-wave-velocity material, and wherein said first reflected wave is a Love wave.

24. The touch sensor according to claim 23, wherein said substrate comprises a borosilicate glass laminated to a soda-lime glass.

25. The touch sensor according to claim 23, wherein said first reflected wave is a Love wave.

26. The touch sensor according to claim 23, wherein said lower shear-wave-velocity material is sufficiently thin to support only the n=0 Love mode.

27. The touch sensor according to claim 1, wherein said transducer comprises a PZT piezoelectric transducer.

28. The touch sensor according to claim 27, wherein said PZT piezoelectric transducer produces compression waves and is mounted on a plastic wedge in contact with said surface of said substrate, for inducing propagation of waves having a longitudinal component in said substrate.

29. The touch sensor according to claim 1, wherein said substrate is curved.

30. The touch sensor according to claim 1, further comprising:

a receiving transducer for receiving an acoustic wave; and a receiving reflecting array, for reflecting a wave from said first reflecting array to said receiving transducer.

31. The touch sensor according to claim 1, wherein said reflecting array comprises an acoustic diffraction grating.

32. The touch sensor according to claim 31, wherein said acoustic diffraction grating has elements of varying height.

33. The touch sensor according to claim 31, wherein said acoustic diffraction grating has elements of varying spacing.

34. The touch sensor according to claim 31, wherein said acoustic diffraction grating has elements of varying orientation.

35. The touch sensor according to claim 1, wherein said perturbation in the surface energy of said first reflected wave is detected as a perturbed wave having a differing volumetric energy distribution along said vertical axis than said first reflected wave.

36. The touch sensor according to claim 35, wherein said perturbed wave is selectively filtered from said first reflected wave.

37. The touch sensor according to claim 31, wherein said acoustic diffraction grating comprises elements which have a shear-type phase velocity which varies from a shear-type phase velocity of an adjacent area.

38. The touch sensor according to claim 1, wherein said wave having a longitudinal component is a Stoneley wave.

39. A touch sensor comprising:
- a substrate capable of propagating a horizontally polarized shear-type wave having an order greater than zero, said substrate having at least one touch surface, a touch on said substrate causing a perturbation of said horizontally polarized shear-type wave;
- a transducer producing a vertically polarized transverse wave having a longitudinal component in a wave propagating area;
- means for converting said vertically polarized transverse wave having a longitudinal component propagating in said wave propagating area into said horizontally polarized shear-type wave having an order greater than zero propagating in said substrate; and
- means for sensing a touch-induced perturbation of said horizontally polarized shear-type wave.

40. A touch position sensor comprising:
- a substrate having at least one touch surface and being capable of propagating an acoustic wave having a horizontal shear-type component substantially parallel to said surface, having a non-uniform volumetric energy density along a vertical axis normal to said surface and having energy at said surface;
- means for reflecting portions of a wave having a longitudinal component as at least an acoustic wave having a horizontal shear-type component substantially parallel to said surface, having a non-uniform volumetric energy density along a vertical axis normal to said surface and having energy at said surface, having an axis, along paths having differing displacements along said axis, said reflecting means being disposed on said substrate;
- means for generating a wave having longitudinal component, propagating in said substrate in a direction along said axis of said reflecting means, a touch on said substrate touch surface perturbing said acoustic wave; and
- means for sensing the time of occurrence of a perturbation.

41. The touch sensor according to claim 40, wherein said acoustic wave having a horizontal shear-type component substantially parallel to said surface, having a non-uniform volumetric energy density along a vertical axis normal to said surface and having energy at said surface is a shear wave having an order greater than zero.

42. The touch position sensor according to claim 40, wherein said substrate has a thickness greater than about three times the Rayleigh wavelength of said acoustic wave.

43. The touch position sensor according to claim 40, wherein said substrate has a thickness greater than about four times the Rayleigh wavelength of said acoustic wave.

44. The touch position sensor according to claim 40, wherein said substrate comprises a glass sheet.

45. The touch position sensor according to claim 40, wherein said substrate comprises a sheet selected from the group consisting of soda-lime glass, borosilicate glass, crystal glass, a laminate of borosilicate glass and soda-lime glass, a laminate of plastic and glass, frosted glass, tempered glass, plastic, metal and ceramic.

46. The touch position sensor according to claim 40, wherein said substrate is a sheet having a shape selected from the group consisting of a flat sheet, a cylindrical section, a spherical section, an ellipsoidal section and a conic section.

47. The touch position sensor according to claim 40, wherein said generating means comprises a first transducer bonded on a surface in acoustic communication with said substrate.

48. The touch position sensor according to claim 47, wherein said generating means comprises a conductive frit for bonding said transducer to said surface.

49. The touch position sensor according to claim 48, further comprising a second transducer bonded on a surface in acoustic communication with said substrate, said second transducer being proximate to said first transducer wherein said conductive frit for bonding said first transducer is continuous with conductive frit to bond said second transducer to said surface.

50. The touch position sensor according to claim 40, further comprising means for reflecting portions of said perturbed acoustic wave as a perturbed wave having a longitudinal component propagating along an axis.

51. The touch position sensor according to claim 40, wherein said sensing means comprises a receiving transducer for receiving information relating to a perturbation of said acoustic wave.

52. The touch position sensor according to claim 40, wherein said generating means and said sensing means employ a common transducer.

53. The touch position sensor according to claim 40, wherein said sensing means selects substantially a single perturbed acoustic wave mode propagating in said substrate and directs said selected perturbed acoustic wave mode to a receiving transducer.

54. The touch position sensor according to claim 40, wherein said acoustic wave propagates at substantially right angles to said wave having a longitudinal component.

55. The touch position sensor according to claim 54, wherein said acoustic wave is a horizontally polarized shear-type wave having an order greater than zero.

56. The touch position sensor according to claim 40, wherein said wave having a longitudinal component is a quasi-Rayleigh wave.

57. The touch position sensor according to claim 40, wherein said acoustic wave is a fourth order horizontally polarized shear-type wave.

58. The touch position sensor according to claim 40, wherein said substrate has a spatial variation in phase propagation velocity of shear wave energy and said acoustic wave is a Love wave of any order.

59. The touch position sensor according to claim 58, wherein said spatial variation is along an axis normal to said surface.

60. The touch position sensor according to claim 40, wherein said perturbed acoustic wave propagates in the same mode as said acoustic wave.

61. The touch position sensor according to claim 40, wherein said perturbed acoustic wave propagates in a different mode as said acoustic wave.

62. A touch sensor comprising:

a substrate having at least one touch surface and being capable of propagating an acoustic wave having a horizontal shear-type component substantially parallel to said surface, having a non-uniform volumetric energy density along a vertical axis normal to said surface and having energy at said surface;

first means for reflecting portions of a wave having a longitudinal component as a first acoustic wave having a horizontal shear-type component substantially parallel to said surface, having a non-uniform volumetric energy density along a vertical axis normal to said surface and having energy at said surface along first paths having differing displacement along a first axis of said first reflecting means; and second means for reflecting portions of a wave having a longitudinal component as a second acoustic wave having a horizontal shear-type component substantially parallel to said surface, having a non-uniform volumetric energy density along a vertical axis normal to said surface and having energy at said surface along first paths having differing displacement along a second axis of said second reflecting means.

63. The touch sensor according to claim 62, wherein at least on of said first acoustic wave and said second acoustic wave is a horizontally polarized shear-type wave having an order greater than zero.

64. The touch sensor according to claim 62, further comprising:

a reflector for reflecting waves having a longitudinal component propagating between said first axis and said second axis; and a transducer for transmitting a wave having longitudinal component along said first axis and for receiving information from said first and second horizontally polarized shear-type waves.

65. The touch sensor according to claim 62, wherein said first reflecting means comprises protuberances from a surface of said substrate having a spacing of an integral multiple of a wavelength of said wave having a longitudinal component and an angle with respect to said first axis such that said first acoustic wave propagates at right angles to said first axis.

66. The touch sensor according to claim 65, wherein said wave having a longitudinal component is a quasi-Raleigh wave having a frequency of about 5.5 MHz, said first acoustic wave is a fourth order horizontally polarized shear-type wave, and said protuberances are set at an angle of 52° from said first axis.

67. The touch sensor according to claim 62, further comprising a first transducer for propagating a wave having a longitudinal component along said first axis and a second transducer for propagating a wave having a longitudinal component along said second axis.

68. The touch sensor according to claim 67, wherein said first transducer and said second transducer produce waves having the same order.

69. The touch sensor according to claim 67, wherein said first transducer is responsive to a wave propagating along said first axis and said second transducer is responsive to a wave propagating along said second axis.

70. The touch sensor according to claim 69, further comprising means for directing energy from said first acoustic wave to said first transducer and means for directing energy from said second acoustic wave to said second transducer.

71. The touch sensor according to claim 62, wherein:

said first reflecting means comprises a first reflective array disposed on said substrate and a second reflective array disposed on said substrate parallel to and spaced from said first reflective array, said first reflective array reflecting said first acoustic wave from said first axis toward said second reflective array; and said second reflecting means comprises a third reflective array disposed on said substrate and a fourth reflective array disposed on said substrate parallel to and spaced from said third reflective array, said third reflective array reflecting said second acoustic wave from said second axis toward said second reflective array.

72. The touch sensor according to claim 62, wherein said first reflecting means comprises:

a first reflective edge of said substrate;

a second reflective edge of said substrate, said second reflective edge being disposed parallel to said first reflective edge and spaced therefrom;

a first array of reflective elements positioned adjacent said first reflective edge; and a second array of reflective elements positioned adjacent said second reflective edge, a wave having a longitudinal component propagating along said first axis intersecting said first array of reflective elements and being reflected by said first array of reflecting elements as said first acoustic wave toward said first reflecting edge, said first reflecting edge reflecting said first acoustic wave toward said second reflecting edge, said second reflecting edge reflecting said first acoustic wave to said second array of reflective elements, and said second array of reflecting elements reflecting said first acoustic wave as a wave having a longitudinal component along said second axis.

73. The touch sensor according to claim 72, further comprising a transmitting acoustic transducer aligned with said first axis and a receiving acoustic transducer aligned with said second axis.

74. The touch sensor according to claim 72, wherein said wave having a longitudinal component also has a vertically polarized transverse component, further comprising members for absorbing waves having vertical components between said first reflective array and said first reflective edge.

75. The touch sensor according to claim 74, further comprising members for absorbing waves having vertical components between said second reflective array and said second reflective edge.

76. The touch sensor according to claim 69, further comprising an analog to digital converter and a digital signal processor, said analog to digital converter digitizing a signal from said first transducer and said digital signal processor receiving said digitized signal and processing said signal to filter signal components to selectively extract information relating to said first acoustic wave.

77. The touch sensor according to claim 67, further comprising means for generating a drive signal and means for controlling the application of said drive signal to said first and second transducers during respective first and second non-overlapping time periods, wherein said first transducer produces a wave having a longitudinal component in said substrate during said first time period and said second transducer produces a wave having a longitudinal component in said substrate during said second time period.

78. The touch sensor according to claim 77, wherein said first and second transducers are responsive to acoustic waves, further comprising a receiving circuit for receiving signals from said first and second transducers, and a circuit for blocking the direct effect of a drive signal from said drive signal generating means from said receiving circuit.

79. The touch sensor according to claim 63, further comprising a first reflective edge of said substrate opposite said first reflecting means and a second reflective edge of said substrate opposite said second reflecting means, said first reflective edge reflecting said first acoustic wave along its incident path to said first reflecting means and said second reflecting edge reflecting said second acoustic wave along its incident path to said second reflecting means.

80. The touch sensor according to claim 63, wherein said substrate has a thickness greater than about three times the Rayleigh wavelength for the substrate material.

81. The touch sensor according to claim 63, wherein said substrate has a thickness greater than about four times the Rayleigh wavelength for the substrate material.

82. The touch sensor according to claim 63, wherein said substrate is formed of one or more materials selected from the group consisting of glass, soda-lime glass, borosilicate glass, leaded crystal glass, silver crystal glass, soda-lime borosilicate glass laminate, tempered glass, frosted glass, plastic, glass plastic laminate, glass-organic polymer laminate, glass-silicone polymer laminate, metal, ceramic, quartz and ion-beam treated transparent sheets.

83. The touch sensor according to claim 63, wherein said substrate has a shape selected from the group consisting of a flat sheet, a curved sheet, a spheric section, an ellipsoidal section, a cylindrical section, a conic section and an aspheric section.

84. The touch sensor according to claim 63, further comprising a transducer mounted on said substrate via a plastic wedge.

85. The touch sensor according to claim 63, further comprising a transducer having a plurality of interdigital electrodes.

86. The touch sensor according to claim 85, wherein said transducer is selectively responsive to an acoustic wave mode propagating in said substrate.

87. The touch sensor according to claim 63, further comprising a transducer mounted to said substrate on a surface contiguous with a touch sensitive surface of said substrate.

88. The touch sensor according to claim 63, further comprising a first transducer and a second transducer mounted on said substrate via a conductive frit, said second transducer being proximate to said first transducer and wherein said conductive frit for bonding said first transducer is continuous with said conductive frit for mounting said second transducer.

89. The touch sensor according to claim 63, further comprising a vertically polarized transverse wave suppressor for attenuating a vertically polarized transverse wave component of said wave having a longitudinal component.

90. The touch sensor according to claim 89, wherein said first and second reflecting means each include an array of reflective elements and are each associated with a vertically polarized transverse wave component suppressor disposed on a surface of said substrate adjacent to each respective array of reflective elements.

91. The touch sensor according to claim 90, wherein said vertically polarized transverse wave component suppressor is disposed on a top surface and a bottom surface of said substrate.

92. The touch sensor according to claim 63, wherein at least one of said first acoustic wave and said second acoustic wave is selected from the group consisting of a third order shear-type wave and a fourth order shear-type wave.

93. The touch sensor according to claim 92, further comprising a bevelled edge of said substrate.

94. The touch sensor according to claim 63, further comprising a first bevelled edge of said substrate associated with said first reflecting means and a second bevelled edge associated with said second reflecting means, said bevelled edges having selective reflection characteristics for acoustic waves having differing volumetric energy density along said vertical axis.

95. An object proximity sensor comprising:
   a substrate having first and second generally parallel edges, and a top touch surface and being capable of propagating an acoustic wave having a horizontal shear-type component substantially parallel to said surface, having a non-uniform volumetric energy density along a vertical axis normal to said surface and having energy at said surface;
   a first transmitting transducer coupled to a surface of said substrate and responsive to a drive signal for imparting a wave having a longitudinal wave component into said substrate, said wave propagating along a first axis parallel to said first edge;
   a first array of reflective elements disposed along said first axis and adjacent to said first edge, said reflective elements being positioned to reflect portions of said wave having a longitudinal wave component along first, substantially parallel paths as an acoustic wave having a horizontal shear-type component substantially parallel to said surface, having a non-uniform volumetric energy density along a vertical axis normal to said surface and having energy at said surface, a touch on said substrate top touch surface forming a perturbation in said acoustic wave propagating along a first path intersecting the position of the touch; and
   a drive signal generator connected to said first transmitting transducer.

96. The object proximity sensor according to claim 95, further comprising means for generating a signal representative of a perturbed acoustic wave propagating in said substrate and means responsive to said representative signal for determining a proximity of an object to said substrate.

97. The object proximity sensor according to claim 95, further comprising a second array of reflective elements disposed along a second axis parallel to, and spaced from, said first axis, said second array of reflective elements being spaced to selectively reflect a portion of said acoustic wave propagating along said first, substantially parallel paths as a wave having a longitudinal wave component.

98. The object proximity sensor according to claim 96, further comprising:
   means for storing a time at which said first transmitting transducer imparts a wave into said substrate;
   means for storing temporal characteristics of said perturbed acoustic wave; and
   means for calculating a position of an object in proximity to said substrate based on said stored time and said stored temporal characteristics.

99. The object proximity sensor according to claim 98, further comprising a sensor system for receiving said perturbed acoustic wave and means for determining a position of an object in proximity to said substrate along an axis having a component which is orthogonal to an axis of said first, substantially parallel paths based on said received perturbed acoustic wave.

100. The object proximity sensor according to claim 99, further comprising means for outputting information relating to a position of said object in proximity to said substrate.

101. The object proximity sensor according to claim 95, further comprising:

third and fourth edges of said substrate;

a second array of reflective elements disposed along a second axis parallel to and spaced from said first axis, said reflective elements of said second array being spaced to selectively reflect a portion of said incident acoustic waves as a wave having a longitudinal wave component propagating along said first, substantially parallel paths along a second axis;

a first receiving transducer, spaced from said first transmitting transducer and being responsive to a received wave from said second array of reflecting elements having a longitudinal wave component, and generating a signal representative thereof;

a second transmitting transducer coupled to a surface of said substrate and responsive to a drive signal for imparting a wave having a longitudinal wave component into said substrate, said wave propagating along a third axis parallel to said third edge;

a third array of reflective elements disposed along said third axis and adjacent to said third edge, said reflective elements of said third array being positioned to reflect portions of said wave having a longitudinal wave component along second, substantially parallel paths as an acoustic wave having a horizontal shear-type component substantially parallel to said surface, having a non-uniform volumetric energy density along a vertical axis normal to said surface and having energy at said surface, a touch on said substrate top touch surface forming a perturbation in said acoustic wave propagating along a second path intersecting the position of the touch; and a fourth array of reflective elements disposed along a fourth axis parallel to and spaced from said third axis, said reflective elements of said fourth array being spaced to selectively reflect a portion of said incident shear-type waves as a wave having a longitudinal wave component propagating along said second, substantially parallel paths along a fourth axis;

a second receiving transducer spaced from said second transmitting transducer, being responsive to a wave having a longitudinal component received from said fourth array of reflecting elements, and generating a signal representative thereof.

102. The object proximity sensor according to claim 101, wherein each of said transducers is mounted on a plastic wedge.

103. The object proximity sensor according to claim 95, wherein said wave having a longitudinal wave component also has a vertical wave component, said sensor further comprising means positioned adjacent to said first reflective array for attenuating said vertical wave component.

104. The object proximity sensor according to claim 103, wherein said attenuating means comprise strips of acoustic wave absorbing material disposed adjacent to said first array of reflective elements.

105. The object proximity sensor according to claim 103, wherein said attenuating means is disposed between said first array of reflecting elements and said first side.

106. The object proximity sensor according to claim 95, wherein said substrate has a thickness which is greater than about three Rayleigh wavelengths for the substrate material.

107. The object proximity sensor according to claim 95, wherein said substrate has a thickness which is about four Rayleigh wavelengths for the substrate material.

108. The object proximity sensor according to claim 95, wherein said substrate comprises a plate of soda-lime glass of 2 mm thickness or more laminated to a plate of borosilicate glass of 3 mm thickness or less, said first transmitting transducer being mounted on said borosilicate glass.

109. The object proximity sensor according to claim 95, wherein said substrate comprises a laminate of a first material having a first shear-type wave phase velocity and a second material having a second shear-type wave phase velocity, said phase velocity of said first material being different from said phase velocity of said second material, said laminate being formed in a manner that efficiently couples shear-type waves between said first material and said second material.

110. The object proximity sensor according to claim 108, wherein said sheet of soda-lime glass is greater than about 2 mm thick and said sheet of borosilicate glass is less than about 3 mm thick.

111. The object proximity sensor according to claim 95, wherein said substrate is transparent and is adapted for transmission of an image from a display device.

112. The object proximity sensor according to claim 95, wherein said elements of said first array of reflective elements are disposed at an angle greater than about 45° from said first axis.

113. The object proximity sensor according to claim 95, wherein said elements of said first array of reflective elements are disposed at an angle of about 52° from said first axis.

114. The object proximity sensor according to claim 95, wherein said first acoustic wave is a horizontally polarized shear-type wave having order greater than zero.

115. A method of detecting an object, comprising:

providing a substrate having at least one touch surface and being capable of propagating an acoustic wave having a horizontal shear-type energy component substantially parallel to said surface, having a nonuniform volumetric energy density along a vertical axis normal to said surface and having energy at said surface;

inducing a first acoustic wave having a longitudinal component along a first axis in the substrate, the first axis being parallel to said surface;

reflecting, as a second acoustic wave, portions of the energy of the first acoustic wave, the second acoustic wave having a horizontal shear-type energy component substantially parallel to the surface, having a nonuniform volumetric energy density along a vertical axis normal to the surface, and having energy at the surface, the second acoustic wave being directed along a second axis in the substrate, different than the first axis, and being parallel to said surface;

perturbing said second acoustic wave by placing an object in proximity to said surface of the substrate; and detecting the perturbed second acoustic wave.

116. The method according to claim 115, wherein:

said perturbing step further comprises redistributing the wave energy of the second acoustic wave among available propagation modes; and said detecting step further comprises detecting wave energy in wave propagation modes not present in said second acoustic wave.

117. The method according to claim 115, further comprising the step of:
reflecting the perturbed wave as a wave having a longitudinal component;
wherein said detecting step comprises detecting acoustic wave energy having a longitudinal component.

118. The method according to claim 115, wherein the first reflected wave is a fourth order horizontally polarized shear-type wave.

119. The method according to claims 115, wherein the induced first acoustic wave is a quasi-Rayleigh wave.

120. The method according to claims 115, wherein the substrate has a vertical variation in shear-type wave phase velocity and the first reflected wave is a Love wave.

121. The method according to claim 115, wherein a said detecting step comprises the substep of receiving the perturbed second acoustic wave with an acoustic-electric transducer, digitizing an electrical signal from the transducer, and digitally processing the digitized signal to compensate for alternate return paths of wave energy received by the transducer.

122. The method according to claim 121, wherein said digitally processing step is adaptive to changing environmental conditions.

123. The method according to claim 115, wherein the wave having a longitudinal component is a Stoneley wave.

124. The method according to claim 123, wherein said second acoustic wave is spacially dispersed over said touch surface, having a width along said second axis, and wherein said detecting step comprises the substeps of providing a transducer having a receiving aperture smaller than said width, and redirecting at least a portion of energy of said second acoustic wave over a distance along said second axis greater than said receiving aperture of said transducer to said transducer.

125. An acoustic device, suitable for coupling to a transducer for imparting a wave having a longitudinal component into the device, the wave having an axis of propagation, said device comprising:

a substrate having a surface, said substrate supporting propagation of waves having a horizontally polarized component and a non-uniform volumetric energy density along an axis normal to said surface; and an array of acoustically reflective elements, on a surface of said substrate, disposed along the axis of wave propagation, each of said elements being disposed at an angle which reflects a wave having a longitudinal component propagating along the axis of wave propagation as a wave having a horizontally polarized component and a non-uniform volumetric energy density along an axis normal to said surface propagating at an angle of 90° to the axis of wave propagation.

* * * * *